(12) United States Patent
Tojo et al.

(10) Patent No.: US 10,811,391 B2
(45) Date of Patent: Oct. 20, 2020

(54) SEMICONDUCTOR DEVICE AND METHOD FOR MANUFACTURING SEMICONDUCTOR DEVICE

(71) Applicants: KABUSHIKI KAISHA TOSHIBA, Minato-ku (JP); TOSHIBA MEMORY CORPORATION, Minato-ku (JP)

(72) Inventors: Akira Tojo, Naka (JP); Kazuo Shimokawa, Yokohama (JP); Masayuki Uchida, Yokohama (JP); Takashi Ito, Yokohama (JP); Masatoshi Tanabe, Yokohama (JP)

(73) Assignees: KABUSHIKI KAISHA TOSHIBA, Minato-ku (JP); TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/271,946

(22) Filed: Feb. 11, 2019

(65) Prior Publication Data

US 2019/0287945 A1  Sep. 19, 2019

(30) Foreign Application Priority Data

Mar. 13, 2018 (JP) .................................. 2018-045587

(51) Int. Cl.
*H01L 25/065* (2006.01)
*H01L 25/00* (2006.01)
*H01L 23/00* (2006.01)

(52) U.S. Cl.
CPC .......... *H01L 25/0657* (2013.01); *H01L 25/50* (2013.01); *H01L 2225/0651* (2013.01);
(Continued)

(58) Field of Classification Search
CPC . H01L 25/117; H01L 25/0657; H01L 25/043; H01L 25/50; H01L 2224/48091;
(Continued)

(56) References Cited

U.S. PATENT DOCUMENTS

| 5,629,835 A * | 5/1997 | Mahulikar .......... H01L 21/4828 361/719 |
| 2003/0011067 A1 * | 1/2003 | Kimura .................. H01L 24/32 257/723 |

(Continued)

FOREIGN PATENT DOCUMENTS

| JP | 2003-152131 | 5/2003 |
| JP | 2004-22928 | 1/2004 |

(Continued)

*Primary Examiner* — Errol V Fernandes
*Assistant Examiner* — Jeremy J Joy
(74) *Attorney, Agent, or Firm* — Oblon, McClelland, Maier & Neustadt, L.L.P.

(57) ABSTRACT

A semiconductor device includes a base, a first semiconductor chip mounted on the base, and a second semiconductor chip provided above the first semiconductor chip. The second semiconductor chip includes a first portion, a second portion including a region directly above a center of the first semiconductor chip, and a third portion including part of a portion of the second semiconductor chip other than a region directly above the first semiconductor chip. The second portion is thicker than the first portion. The third portion is thicker than the second portion and is disposed at a position sandwiching the first semiconductor chip.

9 Claims, 28 Drawing Sheets

(52) U.S. Cl.
CPC .............. *H01L 2225/06506* (2013.01); *H01L 2225/06562* (2013.01)

(58) Field of Classification Search
CPC ... H01L 2224/48145; H01L 2225/0651; H01L 2225/06506
See application file for complete search history.

(56) References Cited

U.S. PATENT DOCUMENTS

| | | | |
|---|---|---|---|
| 2004/0000723 A1* | 1/2004 | Egawa ................ | H01L 23/3128 257/777 |
| 2005/0068739 A1* | 3/2005 | Arvelo ................... | H01L 23/42 361/718 |
| 2005/0194673 A1* | 9/2005 | Kwon ................ | H01L 25/0657 257/686 |
| 2006/0012022 A1* | 1/2006 | Ararao ................ | H01L 25/0652 257/689 |
| 2008/0054451 A1* | 3/2008 | Bauer ................. | H01L 25/0657 257/723 |
| 2012/0075030 A1 | 3/2012 | Iwasaki et al. | |
| 2015/0028472 A1* | 1/2015 | Jung ................... | H01L 25/0657 257/737 |
| 2017/0033081 A1* | 2/2017 | Yoo .................... | H01L 25/0657 |
| 2018/0122789 A1* | 5/2018 | Kang ..................... | H01L 24/24 |
| 2019/0067250 A1 | 2/2019 | Tojo et al. | |

FOREIGN PATENT DOCUMENTS

| | | |
|---|---|---|
| JP | 3507059 | 3/2004 |
| JP | 2004-296724 | 10/2004 |
| JP | 2007-103680 | 4/2007 |
| JP | 2009-16717 | 1/2009 |
| JP | 2009-26843 | 2/2009 |
| JP | 2010-28025 | 2/2010 |
| JP | 5192610 | 5/2013 |
| JP | 5840479 | 1/2016 |
| JP | 2019-41053 A | 3/2019 |

* cited by examiner

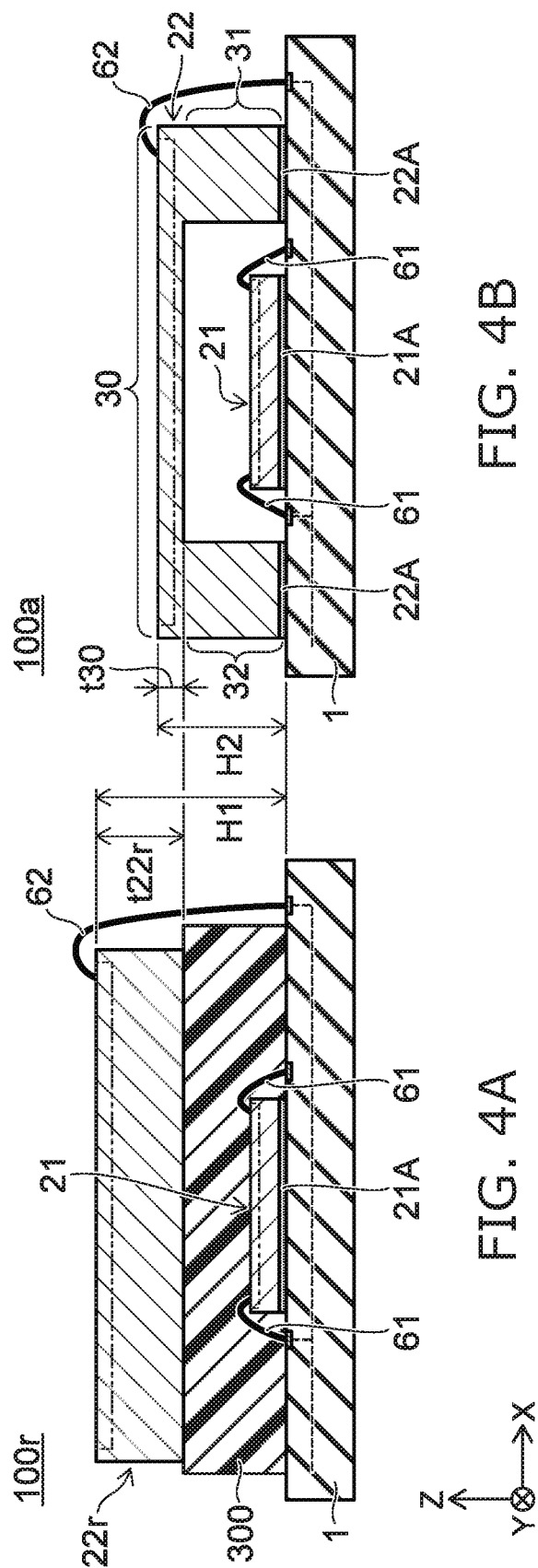

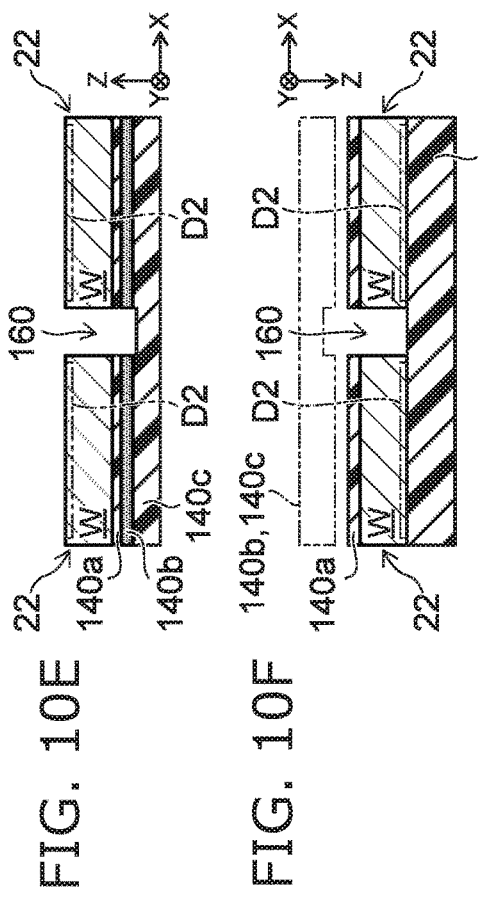
FIG. 10A
FIG. 10B
FIG. 10C
FIG. 10D
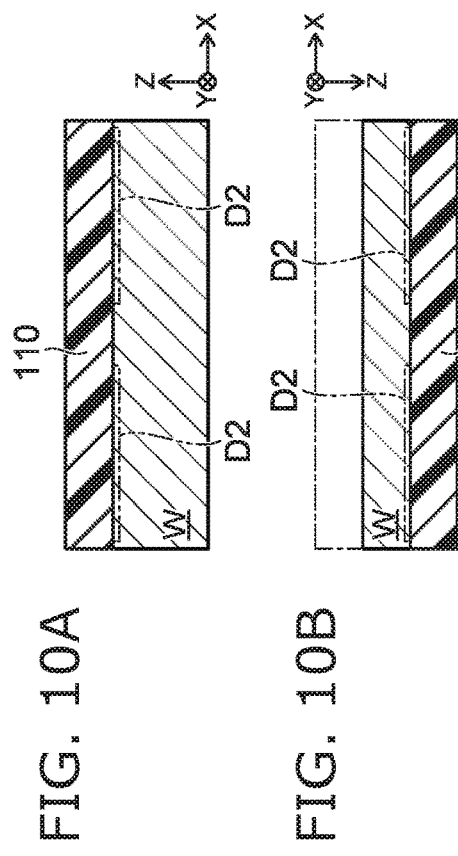
FIG. 10E
FIG. 10F
FIG. 10G
FIG. 10H

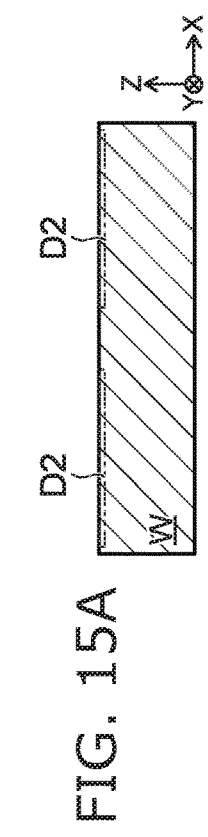
FIG. 15A
FIG. 15B
FIG. 15C
FIG. 15D
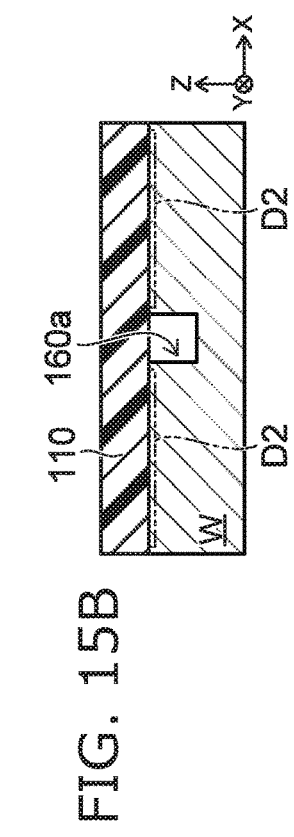
FIG. 15E
FIG. 15F
FIG. 15G
FIG. 15H

SEMICONDUCTOR DEVICE AND METHOD FOR MANUFACTURING SEMICONDUCTOR DEVICE

CROSS-REFERENCE TO RELATED APPLICATIONS

This application is based upon and claims the benefit of priority from Japanese Patent Application No. 2018-045587, filed on Mar. 13, 2018; the entire contents of which are incorporated herein by reference.

FIELD

Embodiments relate to a semiconductor device and a method for manufacturing the same.

BACKGROUND

A semiconductor device is known in which multiple semiconductor chips are stacked. It is desirable for such a semiconductor device to be thinner.

BRIEF DESCRIPTION OF THE DRAWINGS

FIG. 4A is a schematic cross-sectional view illustrating a semiconductor device according to a reference example;

FIG. 4B is a schematic cross-sectional view illustrating the semiconductor device according to the first embodiment;

FIG. 9A to FIG. 10H are schematic cross-sectional views in order of the processes, illustrating a method for manufacturing a semiconductor device according to a fourth embodiment;

FIG. 14A to FIG. 15H are schematic perspective views in order of the processes, illustrating a method for manufacturing a semiconductor device according to a sixth embodiment;

DETAILED DESCRIPTION

Figure 1A:
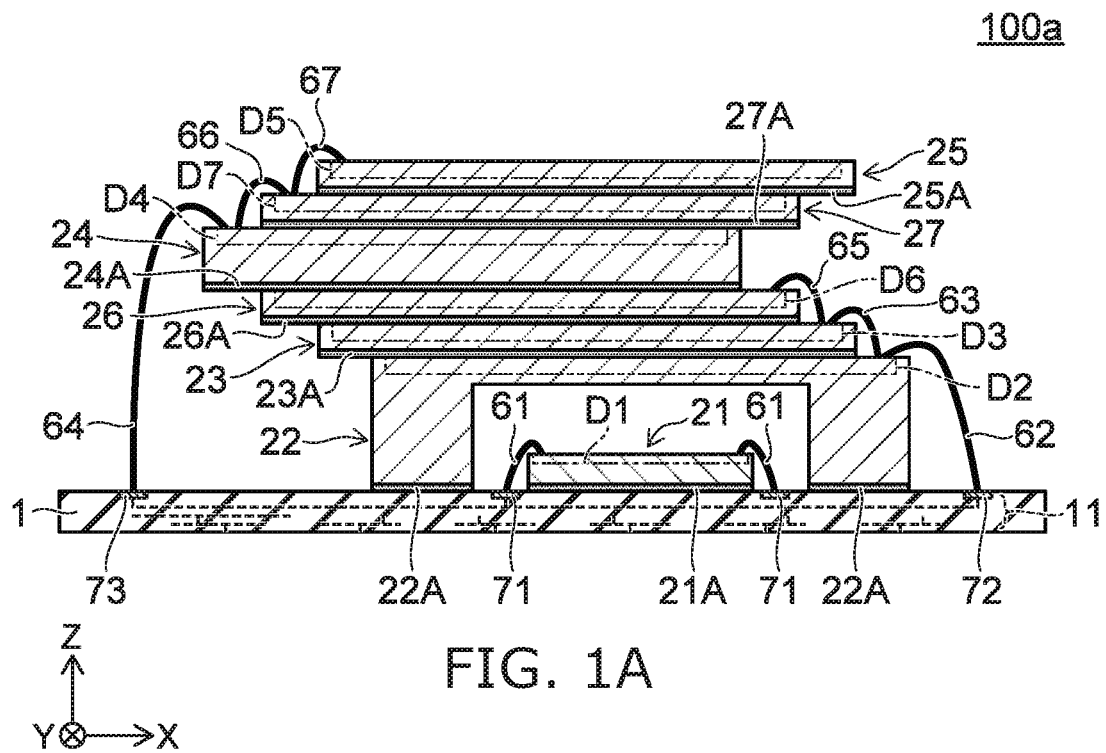
FIG. 1A and FIG. 1B are schematic cross-sectional views illustrating a semiconductor device according to a first embodiment.

A semiconductor device according to one embodiment includes a base, a first semiconductor chip mounted on the base, and a second semiconductor chip provided above the first semiconductor chip. The second semiconductor chip includes a first portion, a second portion including a region directly above a center of the first semiconductor chip, and a third portion including part of a portion of the second semiconductor chip other than a region directly above the first semiconductor chip. The second portion is thicker than the first portion. The third portion is thicker than the second portion and is disposed at a position sandwiching the first semiconductor chip.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
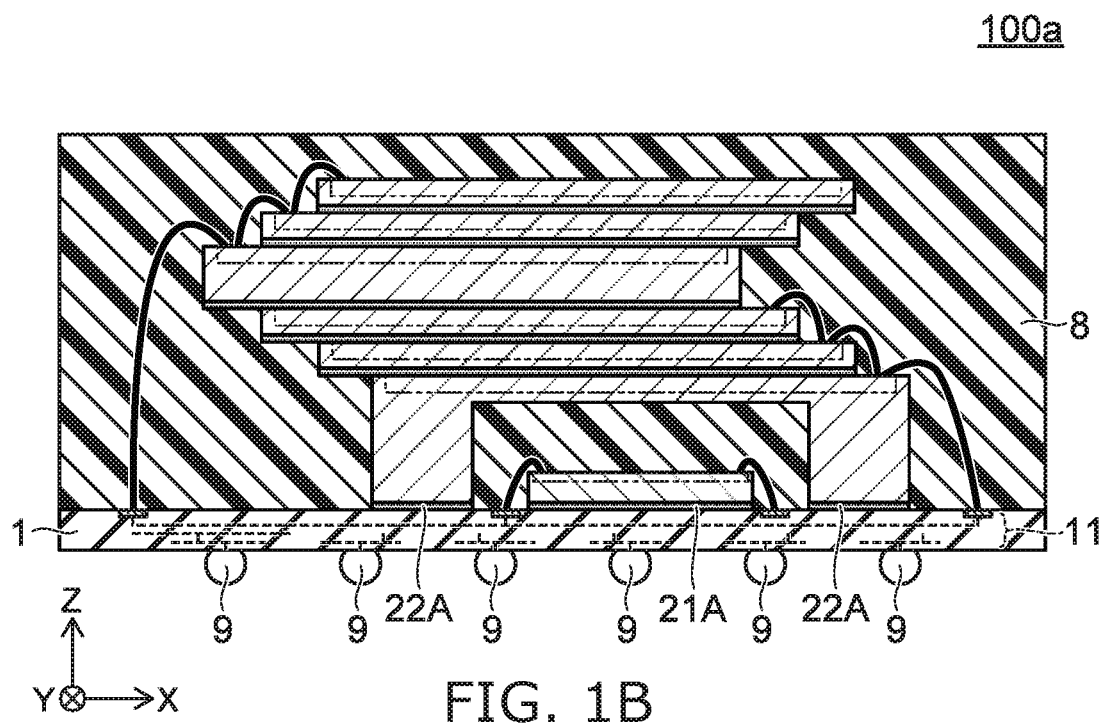

FIG. 1A and FIG. 1B are schematic cross-sectional views illustrating a semiconductor device according to a first embodiment.

An XYZ orthogonal coordinate system is employed for convenience of description in the specification. Although one of the Z-axis directions also is called "up" and the other of the Z-axis directions also is called "down," these notations are for convenience and are independent of the direction of gravity.

As shown in FIG. 1A, the semiconductor device 100a according to the first embodiment includes a base 1 and semiconductor chips 21 to 27. The base 1 includes an interconnect group 11 including multiple interconnects. The base 1 includes, for example, an insulating resin; and the interconnect group 11 is provided in the interior of the insulating resin. Mutually-orthogonal directions parallel to the upper surface of the base 1 are taken as an "X-axis direction" and a "Y-axis direction." The stacking direction of the semiconductor chips 21 to 27 is the "Z-axis direction." A direction that is in the Z-axis direction from the base 1 toward the semiconductor chip 21 is taken as "up;" and the reverse direction is taken as "down."

As shown in FIG. 1B, an insulative sealing member 8 is provided on the base 1. The insulative sealing member 8 surrounds the semiconductor chips 21 to 27. The semiconductor chips 21 to 27 are insulatively sealed by the insulative sealing member 8. The state shown in FIG. 1B is a semiconductor package. The semiconductor chips 21 to 27 respectively include semiconductor element portions D1 to D7. A not-illustrated semiconductor element is provided in each of the semiconductor element portions D1 to D7. In the first embodiment, the semiconductor chip 21 is, for example, a controller chip. The semiconductor chips 22 to 27 each are, for example, semiconductor memory chips. The semiconductor chip 21 is electrically connected to the semiconductor chips 22 to 27 and controls the semiconductor chips 22 to 27. Multiple external terminals 9 are provided at the base 1. Each of the multiple external terminals 9 is electrically connected to at least one of the interconnects included in the interconnect group 11 and is electrically connected to, for example, the semiconductor chip 21, etc.

Figure 2A:
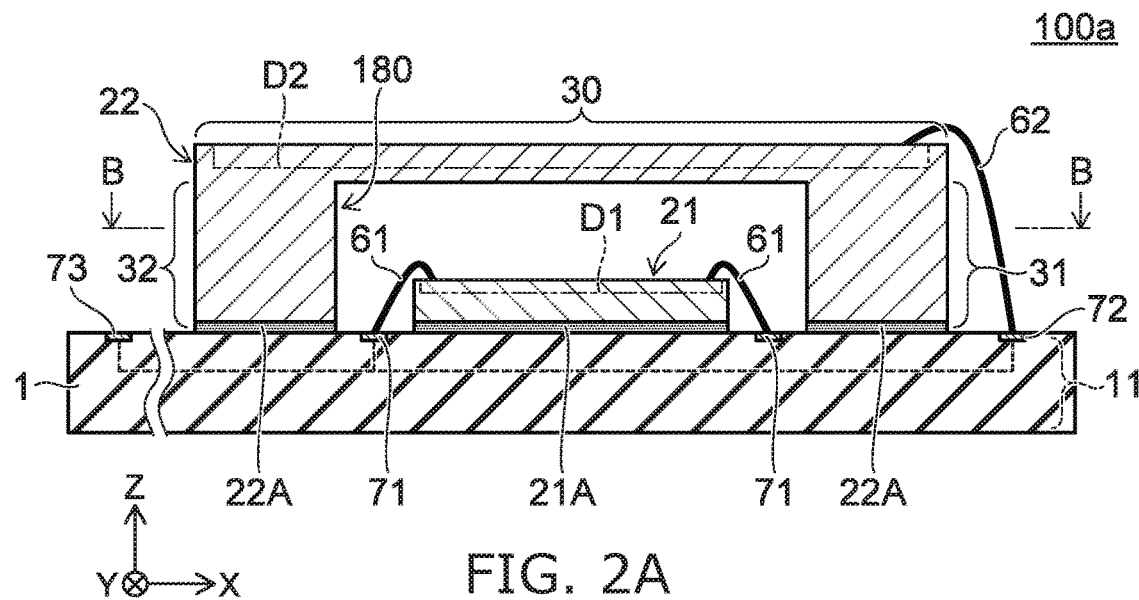
FIG. 2A is a schematic cross-sectional view illustrating the semiconductor device according to the first embodiment.
Figure 2B:
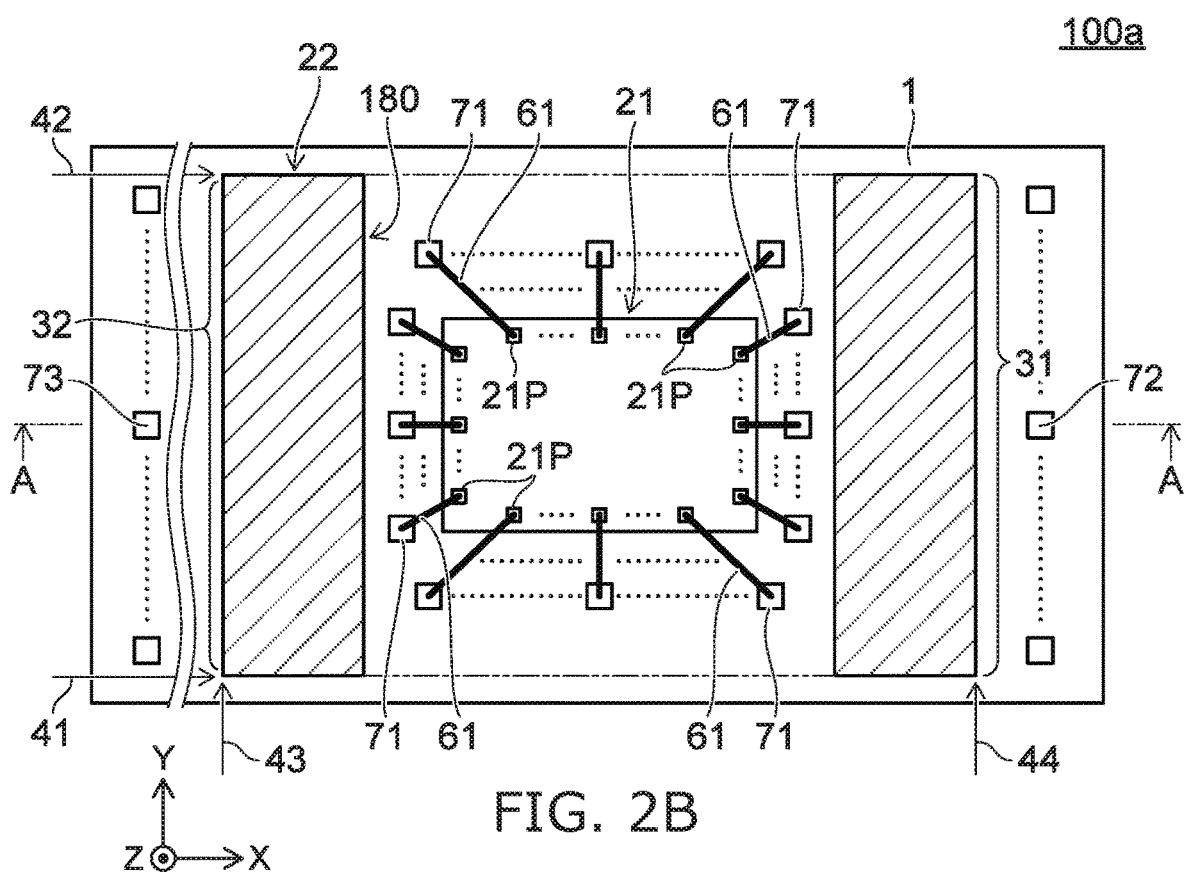
FIG. 2B is a schematic plan view illustrating the semiconductor device according to the first embodiment.

FIG. 2A is a schematic cross-sectional view illustrating the semiconductor device according to the first embodiment. FIG. 2B is a schematic plan view illustrating the semiconductor device according to the first embodiment. The base 1 and the semiconductor chips 21 and 22 are shown in FIG. 2A and FIG. 2B. Also, a portion of the semiconductor chip 22 is shown as a cross section in FIG. 2B. The cross section shown in FIG. 2B is along line B-B in FIG. 2A. The cross section shown in FIG. 2A is along line A-A in FIG. 2B.

As shown in FIG. 2A and FIG. 2B, the semiconductor chip 22 includes a region 30 including the semiconductor element portion D2, a portion 31 continuous with the region 30, and a portion 32 continuous with the region 30. In the specification, for example, "continuous" includes the region 30, the portion 31, and the portion 32 being made of, for example, one semiconductor substrate. In the first embodiment, the portions 31 and 32 are not bonded to the region 30 but have an "integral structure." The semiconductor chip 22 has, for example, a trench 180. The trench 180 is provided in the semiconductor chip 22 to be surrounded with the region 30, the portion 31, and the portion 32. In the first embodiment, the trench 180 has a line pattern and extends in, for example, the Y-axis direction.

The region 30 has a flat surface. The flat surface spreads in the X-axis direction and the Y-axis direction. As shown in FIG. 2B, the region 30 has end surfaces 41 to 44. The end surfaces 41 and 42 each extend in the X-axis direction; and the end surface 42 is separated from the end surface 41. The end surfaces 43 and 44 each extend in the Y-axis direction; and the end surface 44 is separated from the end surface 43. In the first embodiment, the portion 31 extends along the end surface 44 from the end surface 41 to the end surface 42. The portion 32 extends along the end surface 43 from the end surface 41 to the end surface 42. The trench 180 is provided from the end surface 41 to the end surface 42. The trench 180 is open to the outside of the semiconductor chip 22 at each of the end surfaces 41 and 42. The portions 31 and 32 each are positioned between the base 1 and the region 30. The portion 32 is separated from the portion 31 in the X-axis direction.

The portions 31 and 32 may not contact the end surfaces 41 to 44.

The semiconductor chip 21 is positioned between the base 1 and the region 30. For example, the semiconductor chip 21 is separated from the portion 31 and the portion 32. The semiconductor chip 21 is provided on the base 1 and is bonded to the base 1 by, for example, a bonding portion 21A.

As shown in FIG. 2A and FIG. 2B, the region 30 is positioned between the semiconductor chip 21 and the semiconductor chip 23. The semiconductor chips 23, 26, and 24 overhang in this order in the negative X-axis direction. The semiconductor chips 27 and 25 overhang in this order in the positive X-axis direction. At least one of the semiconductor chips 26 may be positioned between the semiconductor chip 24 and the semiconductor chip 23. At least one of the semiconductor chips 27 may be positioned between the semiconductor chip 25 and the semiconductor chip 24. The number of stacks of semiconductor chips is arbitrary. In the first embodiment, for example, the semiconductor chips 22, 23, 26, 24, 27, and 25 are stacked in the Z-axis direction in this order. These semiconductor chips may be bonded to each other respectively by bonding portions 23A, 26A, 24A, 27A, and 25A in order.

Figure 3A:
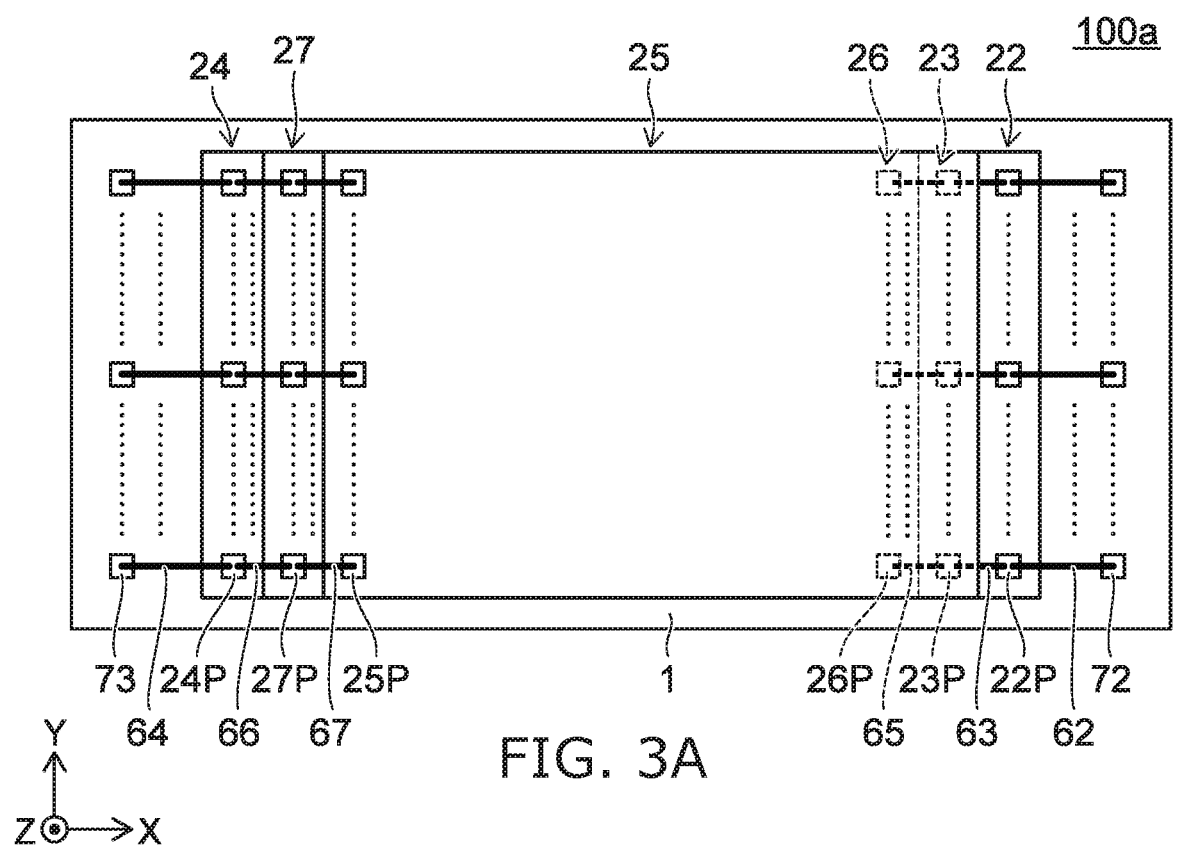
FIG. 3A and FIG. 3B are schematic plan views illustrating the semiconductor device according to the first embodiment.
Figure 3B:
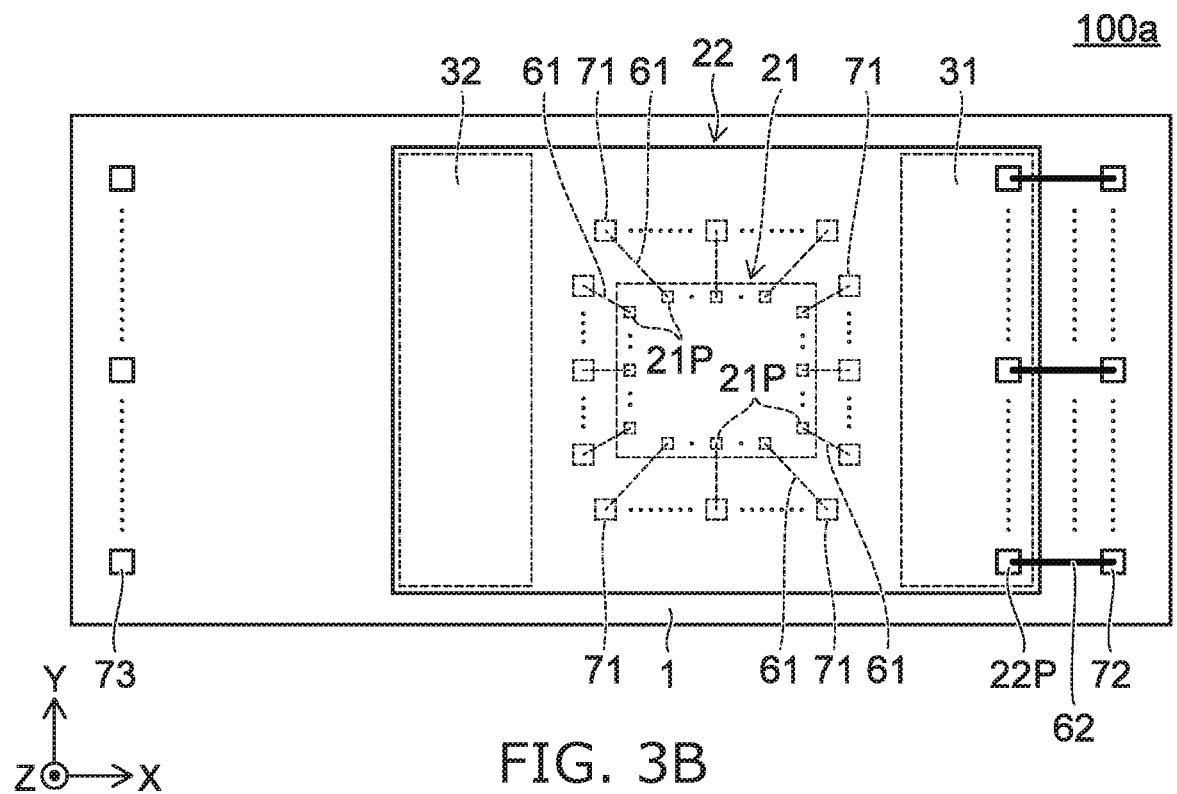

FIG. 3A and FIG. 3B are schematic plan views illustrating the semiconductor device according to the first embodiment. In FIG. 3A and FIG. 3B, the state before being insulatively sealed is shown. FIG. 3A shows the plane after the semiconductor chips 23 to 27 are stacked; and FIG. 3B shows the plane before the semiconductor chips 23 to 27 are stacked.

As shown in FIG. 3A and FIG. 3B, multiple terminal electrodes 71 to 73 are provided in the base 1 (the terminal electrode 71 is not shown in FIG. 3A; for the terminal electrode 71, refer to FIG. 1A to FIG. 2B). The terminal electrodes 71 to 73 are electrically connected to at least one of the interconnects included in the interconnect group 11 (for the interconnect group 11, refer to FIG. 2A). The electrical connection state between the terminal electrodes 71 to 73 and the interconnects included in the interconnect group 11 is set arbitrarily according to the semiconductor device. Multiple pad electrodes 21P to 27P are provided respectively in the semiconductor chips 21 to 27 (for the pad electrode 21P, refer to FIG. 2B). The pad electrodes 21P to 27P are electrically connected respectively to the semiconductor element portions D1 to D7 (for the semiconductor element portions D1 to D7, refer to FIG. 1A, etc.). In the first embodiment, for example, the pad electrode 22P is provided on the portion 31 (referring to FIG. 3B). The terminal electrodes 71 to 73 are electrically connected respectively to the pad electrodes 21P, 22P, and 24P via interconnect members 61, 62, and 64.

The pad electrode 22P is electrically connected to the pad electrode 23P via the interconnect member 63. The pad electrode 23P is electrically connected to the pad electrode 26P via the interconnect member 65. The pad electrode 24P is electrically connected to the pad electrode 27P via the interconnect member 66. The pad electrode 27P is electrically connected to the pad electrode 25P via the interconnect member 67. Thereby, for example, the semiconductor chip 21 is electrically connected to the semiconductor chips 22 to 27. The interconnect members 61 to 67 each are, for example, bonding wires. The interconnect members 61 to 67 are not limited to bonding wires; and another electrical connection method may be employed. For example, each or at least one of the interconnect members 61 to 67 may include a bump electrode of a flip-chip semiconductor device. It is also possible to use bonding wires and bump electrodes in combination. For example, a bump electrode may be used as the interconnect member 61, bonding wires may be used as the interconnect members 62 to 67, etc.

The semiconductor chip 22 is provided on the base 1 with the trench 180 oriented toward the base 1. According to the first embodiment, the trench 180 that has, for example, a line pattern configuration is obtained between the region 30 and the base 1. The semiconductor chip 21 is positioned inside the trench 180 on the base 1. For example, the trench 180 of the first embodiment has two open-end portions. As shown in FIG. 1B, for example, the insulative sealing member 8 can be filled into such a trench 180. For example, it is possible to further provide the insulative sealing member 8 at least between the portion 31 and the portion 32. For example, the insulative sealing member 8 further surrounds the semiconductor chip 21 inside the trench 180.

FIG. 4A is a schematic cross-sectional view illustrating a semiconductor device according to a reference example. FIG. 4B is a schematic cross-sectional view illustrating the semiconductor device according to the first embodiment.

As shown in FIG. 4A, the semiconductor device 100r according to the reference example is an example in which a low-elastic resin material 300 is provided on the semiconductor chip 21 and the interconnect member 61; and a semiconductor chip 22r is mounted on the low-elastic resin material 300. The semiconductor device 100r has a structure in which the interconnect member 61 is buried in the low-elastic resin material 300. For example, to maintain the loop shape of the interconnect member 61, the low-elastic resin material 300 includes, for example, an insulating resin material that has a low viscosity and softens easily due to heat. For example, the elastic modulus of the low-elastic resin material 300 is low compared to that of the wire interconnect material of the interconnect members 61 to 67. Therefore, the low-elastic resin material 300 deforms easily compared to the wire interconnect material. Moreover, the thickness in the Z-axis direction of the low-elastic resin material 300 is set to be sufficiently thicker than the height of the interconnect member 61. Or, in the case where a flip-chip connection of the semiconductor chip 21 is used, the thickness in the Z-axis direction is set to be sufficiently thicker than the height of the semiconductor chip 21. For example, this is to suppress the deformation and breaking of the interconnect member 61. In the semiconductor device 100r, if a thickness t22r in the Z-axis direction of the semiconductor chip 22r is set to be thin, for example, the following circumstances may occur:

(1) There is a possibility that vibrations may occur when performing wire bonding of the interconnect member 62 due to flexing of the semiconductor chip 22r.

(2) There is a possibility that the semiconductor chip 22r may be warped by heat in, for example, a heating process.

Therefore, the thickness t22r must be set to be thick. In the semiconductor device 100r, for example, a thickness H1 in the Z-axis direction above the base 1 easily becomes thick. Accordingly, in the semiconductor device 100r, it is difficult to reduce the thickness of the package.

Conversely, in the semiconductor device 100a according to the first embodiment, instead of the low-elastic resin material 300, for example, the portion 31 and the portion 32 are provided in the semiconductor chip 22. For example, it is assumed that the thickness in the Z-axis direction of the low-elastic resin material 300 and the thicknesses in the Z-axis direction of the portion 31 and the portion 32 are set to be substantially equal (including, for example, the thickness in the Z-axis direction of the bonding portion 21A).

The portion 31 and the portion 32 are a semiconductor substrate, e.g., a silicon substrate. Therefore, the portion 31 and the portion 32 do not deform easily compared to the low-elastic resin material 300. The region of the semiconductor chip 22 of the first embodiment that corresponds to the semiconductor chip 22r of the reference example is the region 30. It is possible to set a thickness t30 in the Z-axis direction of the region 30 to be thinner than the thickness t22r while suppressing the "flexing" and the "warp." Accordingly, according to the semiconductor device 100a according to the first embodiment, for example, a thickness H2 in the Z-axis direction above the base 1 can be thin compared to the thickness H1.

Thus, according to the first embodiment, a semiconductor device can be provided in which it is possible to reduce the thickness of the package. Further, the number of stacks of semiconductor chips also can be increased while suppressing the increase of the thickness of the package.

For example, the low-elastic resin material 300 is expensive compared to a DAF material having a thickness of about 5 to 10 μm. The manufacturing cost of the semiconductor device 100r increases easily. However, for example, the semiconductor device 100a of the first embodiment does not need to use the low-elastic resin material 300. For example, it is possible to use a DAF material as the bonding portion 21A of the semiconductor device 100a. Accordingly, according to the semiconductor device 100a according to the first embodiment, the increase of the manufacturing cost also can be suppressed compared to the semiconductor device 100r according to the reference example.

Further, an advantage also can be obtained in that, for example, the interconnect member 62 and/or the interconnect member 64 do not break easily in the wire bonding process and/or the resin sealing process when packaging.

This is because the interconnect member 62 that is bonded to the semiconductor chip 22r shown in FIG. 4A and the interconnect member 64 that is bonded to the semiconductor chip 24 of FIG. 1A in the case where the low-elastic resin material 300 is applied easily undergo flexing and/or vibrations when bonding because the rigidity of the low-elastic resin material 300 shown in FIG. 4A is low. Therefore, the bonding energy (the load and/or the ultrasonic wave) that is applied from the bonding apparatus easily becomes unstable or insufficient. Therefore, in the semiconductor device 100r, sufficient bonding strengths are not obtained easily for the bonding strength between the interconnect member 62 and the pad electrode 22P and the bonding strength between the interconnect member 64 and the pad electrode 24P.

Conversely, in the case of the interconnect member 62 bonded to the semiconductor chip 22 shown in FIG. 4B and the interconnect member 64 bonded to the semiconductor chip 24 of FIG. 1A, the portion 31 and the portion 32 each have high rigidities; and flexing does not occur easily. Accordingly, in the semiconductor device 100a, the bonding energy that is applied from the bonding apparatus can be obtained sufficiently compared to the semiconductor device 100r; and the bonding strength between the interconnect member 62 and the pad electrode 22P and the bonding strength between the interconnect member 64 and the pad electrode 24P each can be high.

For example, the thermal expansion coefficient (Coefficient of Thermal Expansion (CTE)) of the low-elastic resin material 300 is large compared to that of silicon. Therefore, for example, there is a possibility that the low-elastic resin material 300 may swell in the heating process; and cracks may initiate in the semiconductor chip 22r, etc.

Conversely, in the first embodiment, for example, it is unnecessary for the insulative sealing member to be filled in the process of performing thermal curing of the bonding portion 21A, etc. Accordingly, the occurrence of cracks in the semiconductor chip 22, etc., can be suppressed.

The semiconductor chip 22 includes the portion 31 and the portion 32 in addition to the region 30. The thickness H2 in the Z-axis direction of the semiconductor chip 22 can be thicker than the thickness t22r in the Z-axis direction of the semiconductor chip 22r of the reference example. Therefore, for the semiconductor device 100a, for example, compared to the semiconductor device 100r of the reference example, it is also possible to improve the rigidity and prevent warp.

In the first embodiment as shown in FIG. 3B, for example, the pad electrode 22P is provided on the portion 31. The portions 31 and 32 are a semiconductor substrate, e.g., a silicon substrate as-is. The thicknesses in the Z-axis direction of the portions 31 and 32 are thicker than the thickness in the Z-axis direction of the portion where the trench 180 is provided. Moreover, the portions 31 and 32 are disposed on the base 1 without the trench 180 being interposed. Accordingly, compared to the portion where the trench 180 is provided, the thickness in the Z-axis direction is thick and the rigidity is high for the portions of the portions 31 and 32. Compared to the portion of the semiconductor chip 22 where the trench 180 is provided, the portions of the portions 31 and 32 are portions that do not deform easily.

Thus, for example, the pad electrode 22P is disposed on at least one of the portion 31 or 32. Thereby, for example, in the wire bonding process, the deformation and/or flexing of the semiconductor chip 22 and the accompanying occurrence of vibrations can be suppressed; and the conditions necessary for the bonding strength can be satisfied. Accordingly, for the semiconductor chip 22 that has the trench 180, an advantage can be further obtained in that the decrease of the bonding strength between the pad electrode 22P and the interconnect member 62 can be suppressed.

Also, for example, the advantages recited above can be improved further by not disposing the pad electrode 22P in the portion of the semiconductor chip 22 on the trench 180.

Other technical effects obtained from the embodiment are described as appropriate in the modifications and the other embodiments described below.

First Embodiment: First Modification

Figure 5A:
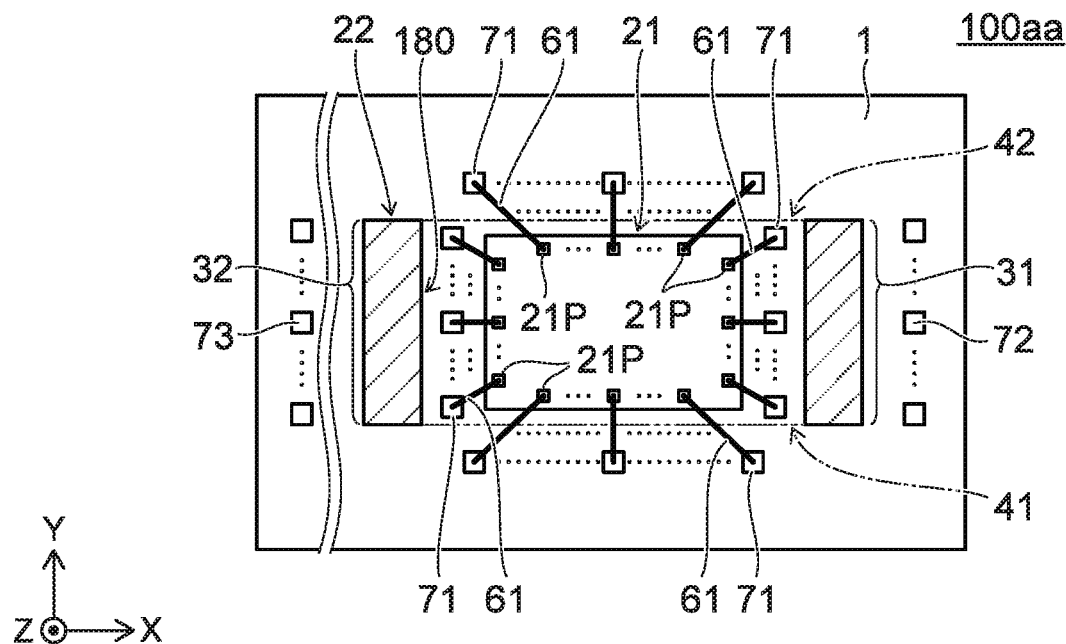
FIG. 5A is a schematic plan view illustrating a semiconductor device according to a first modification of the first embodiment.

FIG. 5A is a schematic plan view illustrating a semiconductor device according to a first modification of the first embodiment. In FIG. 5A, a portion of the semiconductor chip 22 is shown as a cross section.

As shown in FIG. 5A, when viewed from a direction along the Z-axis direction, it is unnecessary for all of the terminal electrodes 71 to be covered with the semiconductor chip 22. For example, the semiconductor chip 22 of the semiconductor device 100aa according to the first modification has the trench 180 that reaches the end surface 42 from the end surface 41 along the Y-axis direction. In the case of such a semiconductor device 100aa, it is possible to dispose some of the terminal electrodes 71 on the base 1 to be positioned outside at least one of the end surface 41 or 42. In FIG. 5A, an example is shown in which some of the terminal electrodes 71 are disposed on the base 1 to be positioned outside each of the end surfaces 41 and 42.

According to the first embodiment, for example, the semiconductor chip 22 has the trench 180 that reaches the end surface 42 from the end surface 41. Accordingly, as shown in the first modification, for example, another advantage also can be obtained in that the degrees of freedom of the arrangement on the base 1 of the terminal electrodes 71 can be increased.

First Embodiment: Second Modification

Figure 5B:
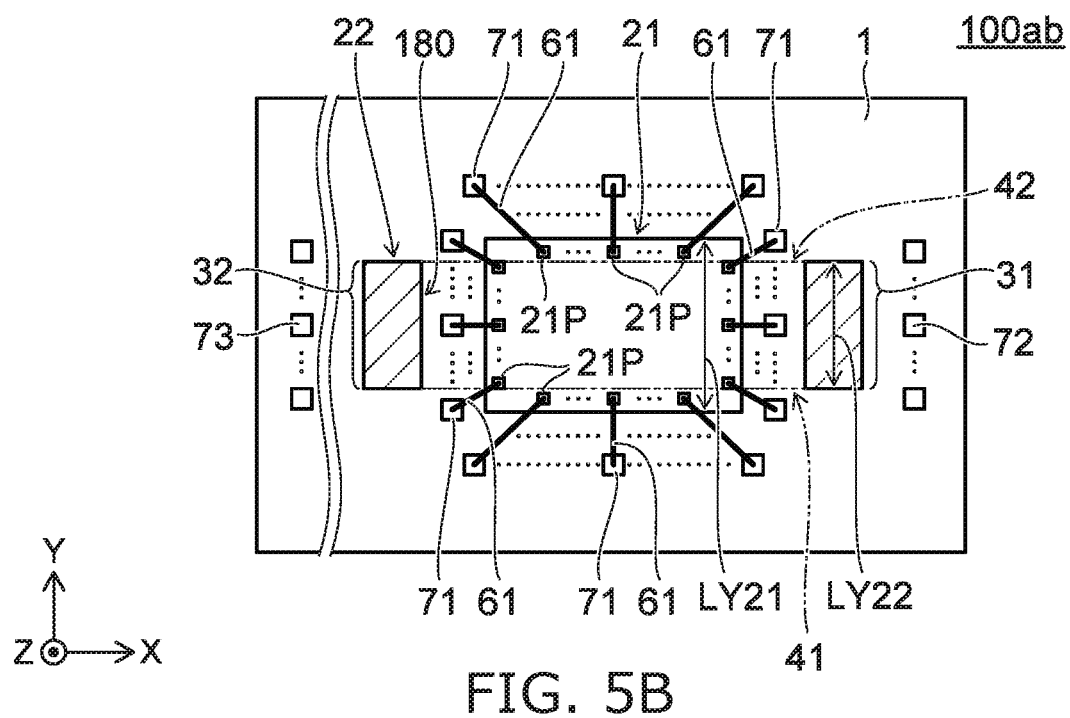
FIG. 5B is a schematic plan view illustrating a semiconductor device according to a second modification of the first embodiment.

FIG. 5B is a schematic plan view illustrating a semiconductor device according to a second modification of the first embodiment. In FIG. 5B, a portion of the semiconductor chip 22 is shown as a cross section.

As shown in FIG. 5B, when viewed from a direction along the Z-axis direction, it is unnecessary for the entire semiconductor chip 21 to be covered with the semiconductor chip 22. For example, the semiconductor chip 21 may be disposed on the base 1 so that at least one of the two end surfaces along the X-axis direction of the semiconductor chip 21 is positioned outside at least one of the end surface 41 or 42.

In the semiconductor device 100ab according to the second modification, a length LY21 in the Y-axis direction of the semiconductor chip 21 is longer than a length LY22 in the Y-axis direction of the semiconductor chip 22. According to the first embodiment, for example, the semiconductor chip 22 has the trench 180 that reaches the end surface 42 from the end surface 41. Therefore, the semiconductor chip 21 can be disposed on the base 1 even in the case where the length LY21 is longer than the length LY22. By this same relationship, the semiconductor chip 22 can be disposed on the base 1 even in the case where the length LY22 is shorter than the length LY21.

According to the first embodiment, as shown in the second modification, the constraints of the chips that can be disposed also can be relaxed. Therefore, for example, an advantage also can be obtained in that modifications of the chip sizes of the semiconductor chips 21 and 22 also can be accommodated easily.

First Embodiment: Third Modification

Figure 6A:
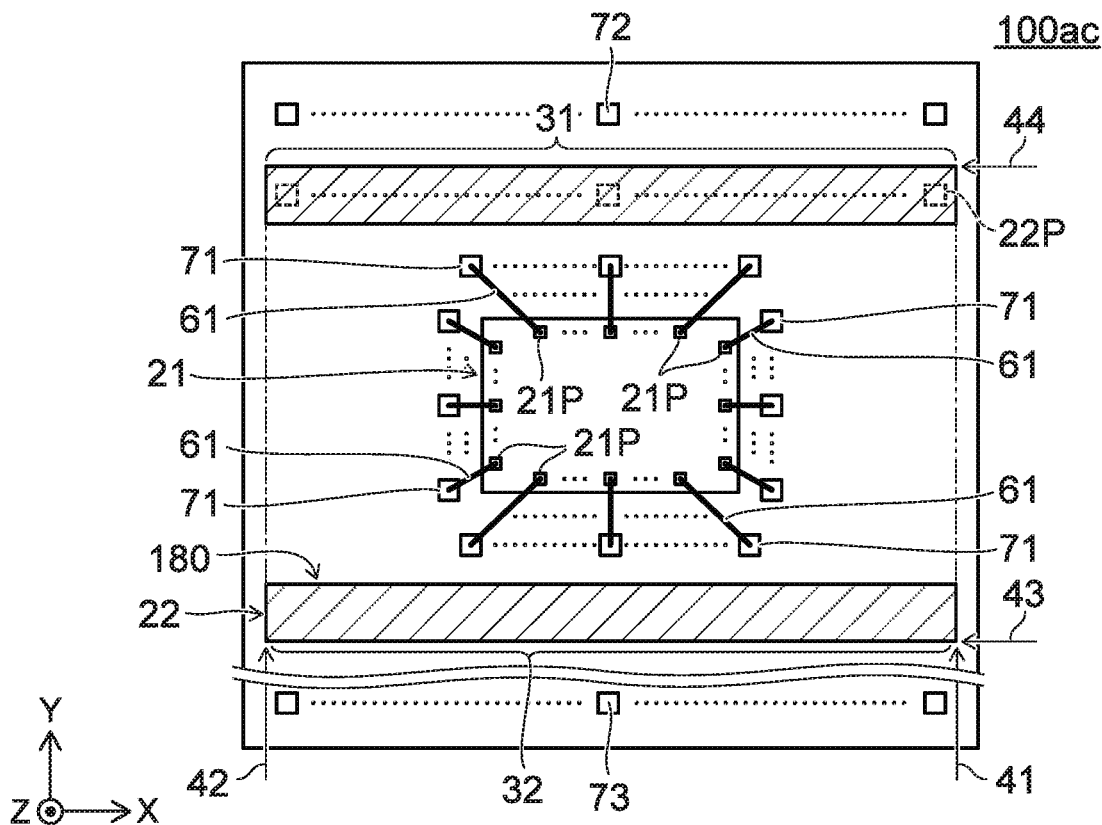
FIG. 6A is a schematic plan view illustrating a semiconductor device according to a third modification of the first embodiment.

FIG. 6A is a schematic plan view illustrating a semiconductor device according to a third modification of the first embodiment. In FIG. 6A, a portion of the semiconductor chip 22 is shown as a cross section.

As shown in FIG. 6A, the configuration of the semiconductor chip 22 when viewed from a direction along the Z-axis direction is a rectangle having a major axis and a minor axis. In such a case, it is also possible to provide the portions 31 and 32 along the major axis. The semiconductor chip 22 of the semiconductor device 100ac according to the third modification has a major axis along the X-axis direction and a minor axis along the Y-axis direction. The portions 31 and 32 each are aligned with the X-axis direction.

According to the first embodiment, the decrease of the rigidity of the semiconductor chip 22 can be relaxed. As in the third modification, by providing each of the portions 31 and 32 along the major-axis direction of the semiconductor chip 22, it is possible to better obtain the effect in which the decrease of the rigidity can be relaxed.

In the third modification as well, for example, it is sufficient for the pad electrode 22P to be disposed on at least one of the portion 31 or 32. Thereby, even in the case where the semiconductor chip 22 includes the region 30 having a thin thickness in the Z-axis direction, the decrease of the bonding strength between the pad electrode 22P and the interconnect member 62 can be suppressed. In the third modification, while maintaining such an effect, the number of the pad electrodes 22P can be increased compared to the case where the portions 31 and 32 are aligned with the minor-axis direction.

First Embodiment: Fourth Modification

Figure 6B:
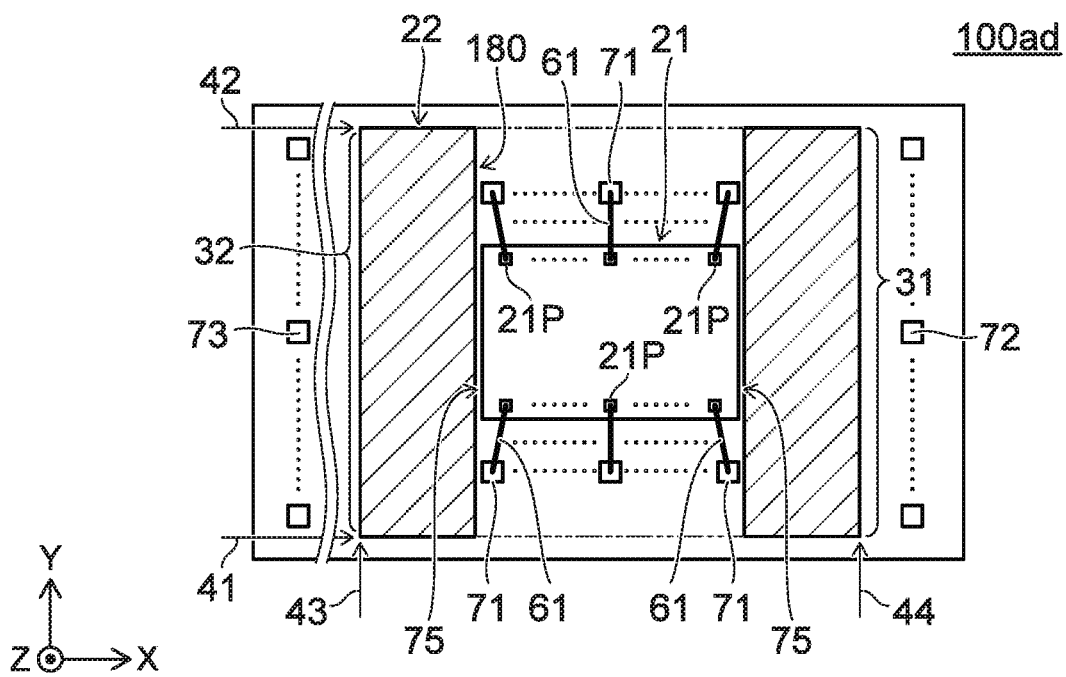
FIG. 6B is a schematic plan view illustrating a semiconductor device according to a fourth modification of the first embodiment.

FIG. 6B is a schematic plan view illustrating a semiconductor device according to a fourth modification of the first embodiment. In FIG. 6B, a portion of the semiconductor chip 22 is shown as a cross section.

As shown in FIG. 6B, the terminal electrodes 71 may not be disposed in one or both of the region between the portion 31 and the semiconductor chip 21 and the region between the portion 32 and the semiconductor chip 21. In FIG. 6B, an example is shown in which the terminal electrodes 71 are not disposed in either of the region between the portion 31 and the semiconductor chip 21 or the region between the portion 32 and the semiconductor chip 21.

When viewed from a direction along the Z-axis direction, the semiconductor chip 21 is a quadrilateral having four sides. For example, in the fourth modification, the pad electrodes 21P are disposed in the semiconductor chip 21 to correspond to one to three sides of the semiconductor chip 21. In FIG. 6B, an example is shown in which the pad electrodes 21P are disposed in the semiconductor chip 21 to correspond to a pair of sides along the X-axis direction. The pad electrodes 21P are not disposed in the regions adjacent to the pair of sides along the Y-axis direction of the semiconductor chip 21. The pair of sides along the Y-axis direction is respectively adjacent to the portions 31 and 32.

For example, the terminal electrodes 71 are disposed in the base 1 to correspond to the one to three sides recited above where the pad electrodes 21P of the semiconductor chip 21 are disposed. In FIG. 6B, an example is shown in which the terminal electrodes 71 are disposed in the base 1 to correspond to the pair of sides along the X-axis direction of the semiconductor chip 21. The terminal electrodes 71 are not disposed respectively between the portions 31 and 32 and the pair of sides along the Y-axis direction of the semiconductor chip 21.

For example, the interconnect members 61 electrically connect the pad electrodes 21P and the terminal electrodes 71 by straddling the one to three sides recited above where the pad electrodes 21P are disposed. In FIG. 6B, an example is shown in which the pad electrodes 21P and the terminal electrodes 71 are electrically connected by the interconnect members 61 straddling the pair of sides along the X-axis direction of the semiconductor chip 21. None of the interconnect members 61 straddle the pair of sides along the Y-axis direction of the semiconductor chip 21.

In the fourth modification, a clearance 75 along the Y-axis direction exists respectively between at least one of the portion 31 or 32 and the pair of sides along the Y-axis direction of the semiconductor chip 21. For example, the insulative sealing member 8 shown in FIG. 1B is provided in the clearance 75 without, for example, including the terminal electrodes 71 and the interconnect members 61. It is also possible for the clearance 75 to be, for example, an air gap without being filled with the insulative sealing member 8. However, to avoid discrepancies due to the expansion of the air by heating, it is favorable to fill the clearance 75 with a material such as an under-fill, an insulating resin material, etc.

In the fourth modification, the length in the X-axis direction of the semiconductor chip 22 can be shortened by reducing, for example, the length along the X-axis direction of the clearance 75. Accordingly, an advantage can be obtained in that the size of the semiconductor chip 22 can be reduced.

In the fourth modification in which the size of the semiconductor chip 22 can be reduced, for example, it is also possible to reduce the size of the base 1. For example, such a fourth modification is advantageous to downsize the semiconductor package.

By reducing, for example, the length along the X-axis direction of the clearance 75, the length in the X-axis direction of at least one of the portion 31 or 32 can be lengthened without modifying the length in the X-axis direction of the semiconductor chip 22. Accordingly, in the fourth modification, it is also possible to further increase the rigidity of the semiconductor chip 22.

It is also possible to eliminate the clearance 75. In the fourth modification, for example, at least one of the portion 31 or 32 may contact the semiconductor chip 21.

Second Embodiment

Figure 7A:
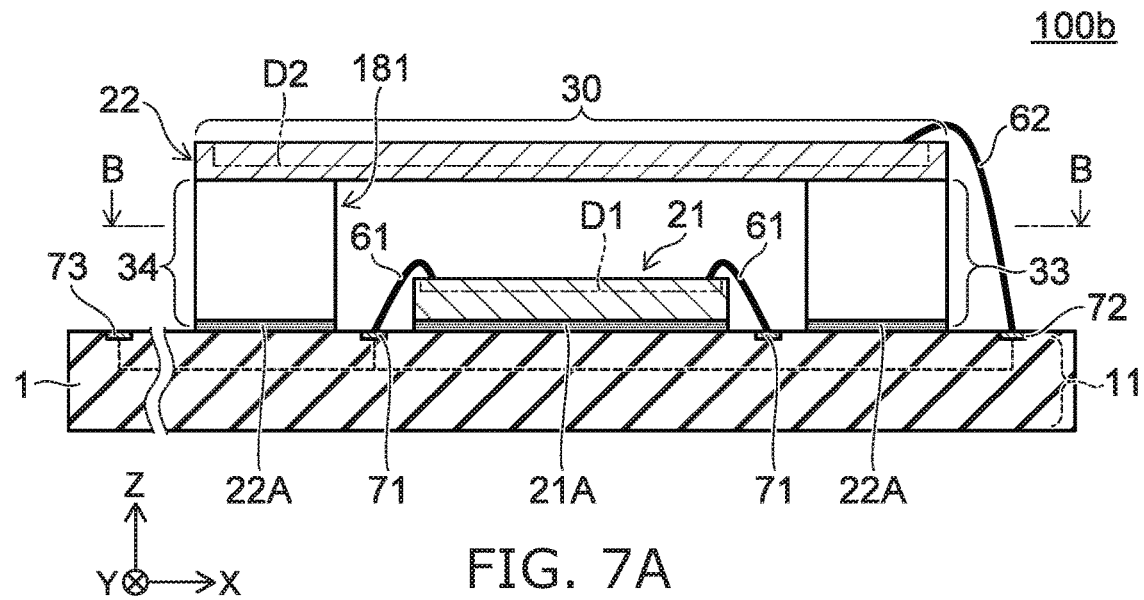
FIG. 7A is a schematic cross-sectional view illustrating a semiconductor device according to a second embodiment.
Figure 7B:
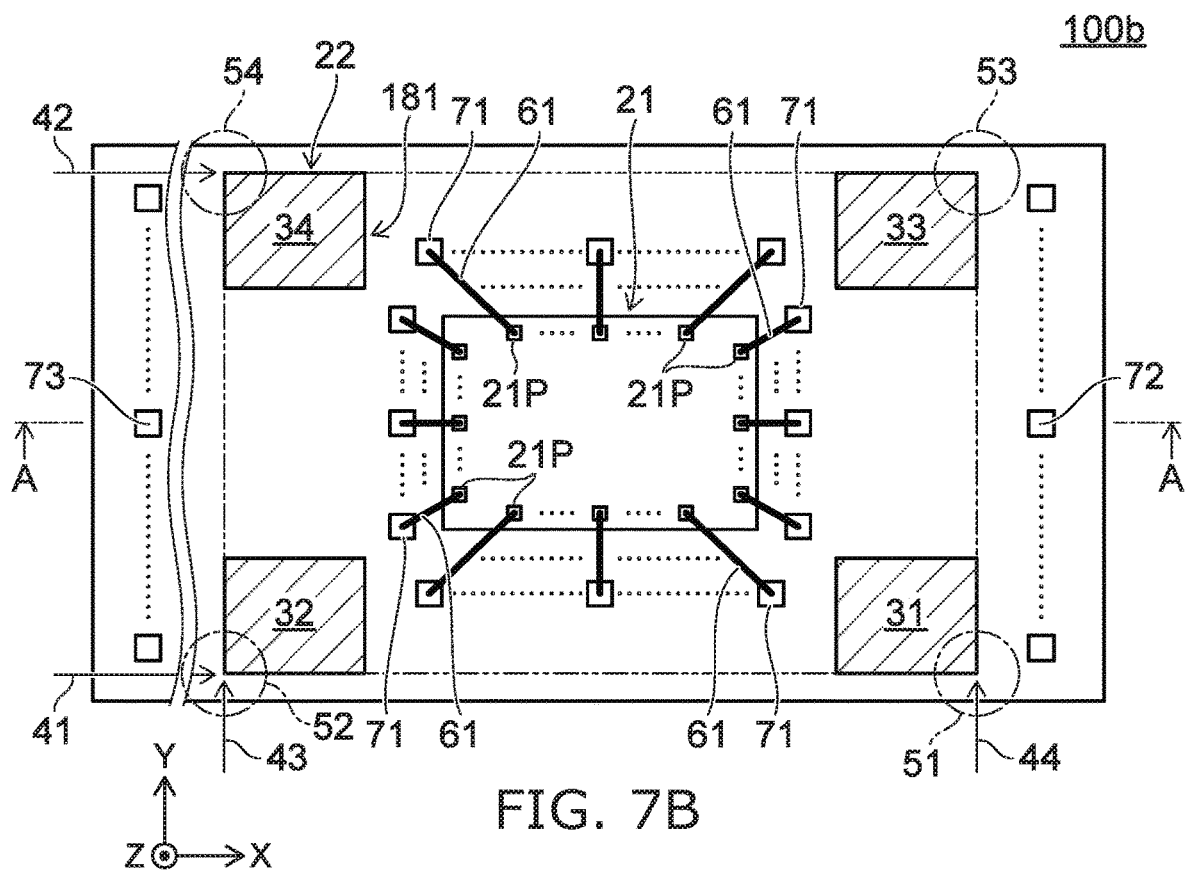
FIG. 7B is a schematic plan view illustrating the semiconductor device according to the second embodiment.

FIG. 7A is a schematic cross-sectional view illustrating a semiconductor device according to a second embodiment. FIG. 7B is a schematic plan view illustrating the semiconductor device according to the second embodiment. The base 1 and the semiconductor chips 21 and 22 are shown in FIG. 7A and FIG. 7B. In FIG. 7B, a portion of the semiconductor chip 22 is shown as a cross section. The cross section shown in FIG. 7B is along line B-B in FIG. 7A. The cross section shown in FIG. 7A is along line A-A in FIG. 7B.

As shown in FIG. 7A and FIG. 7B, compared to the semiconductor chip 22 of the first embodiment, the semiconductor chip 22 of the semiconductor device 100b according to the second embodiment further includes a portion 33 and a portion 34.

The portion 33 is continuous with the region 30. The portion 33 is separated from each of the portion 31 and the portion 32 in the Y-axis direction. The portion 34 is continuous with the region 30. The portion 34 is separated from the portion 33 in the X-axis direction and is separated from each of the portion 31 and the portion 32 in the Y-axis direction. For example, the semiconductor chip 21 is separated from each of the portion 33 and the portion 34.

The semiconductor chip 22 has corner portions 51 to 54. The end surface 41 and the end surface 44 cross at the corner portion 51. The end surface 41 and the end surface 43 cross at the corner portion 52. The end surface 42 and the end surface 44 cross at the corner portion 53. The end surface 42 and the end surface 43 cross at the corner portion 54. For example, the portions 31 to 34 are positioned respectively in the regions including the corner portions 51 to 54.

The portions 31 to 34 may not contact the corner portions 51 to 54.

A trench 181 of the semiconductor chip 22 of the second embodiment has a cross pattern and extends in each of the X-axis direction and the Y-axis direction. The trench 181 has four end portions. The four end portions open to the outside of the semiconductor chip 22 respectively at the end surfaces 41 to 44. According to the second embodiment, for example, the trench 181 that has the cross pattern configuration is obtained between the region 30 and the base 1. The semiconductor chip 21 is positioned in the trench 181 on the base 1.

The semiconductor chip 22 may include, for example, the portions 31 to 34. According to the second embodiment, the trench 181 that has four open-end portions is obtained between the region 30 and the base 1. According to the second embodiment including such a trench 181, for example, compared to the first embodiment, there are many filling paths of the resin; therefore, an advantage can be obtained in that the insulative sealing member 8 is filled more easily into the trench 181.

In the second embodiment as well, modifications similar to the first to fourth modifications of the first embodiment are possible.

Third Embodiment

Figure 8A:
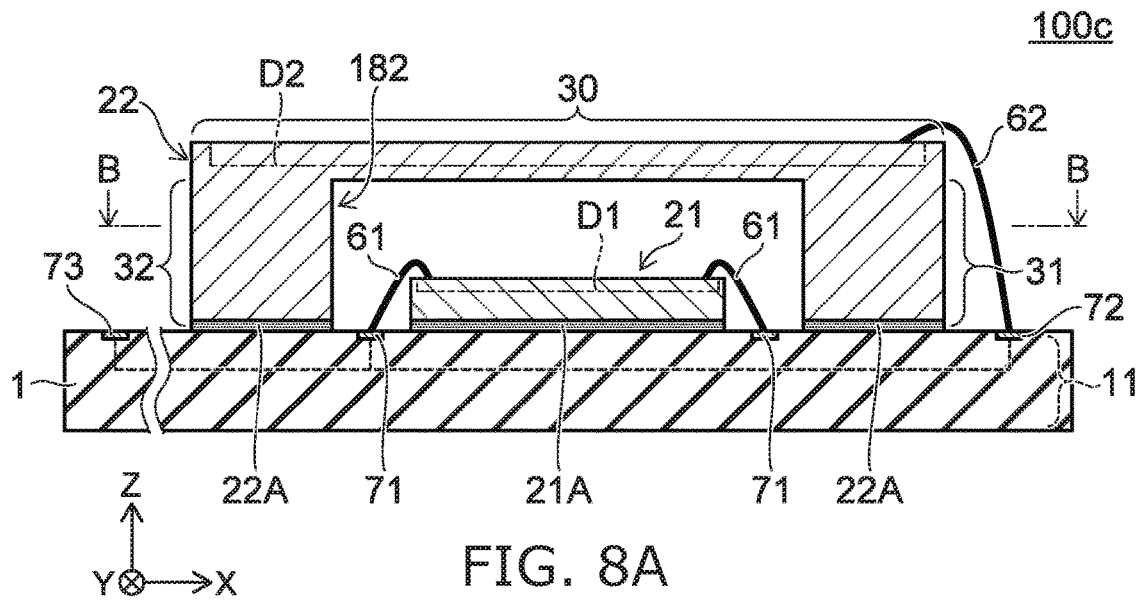
FIG. 8A is a schematic cross-sectional view illustrating a semiconductor device according to a third embodiment.
Figure 8B:
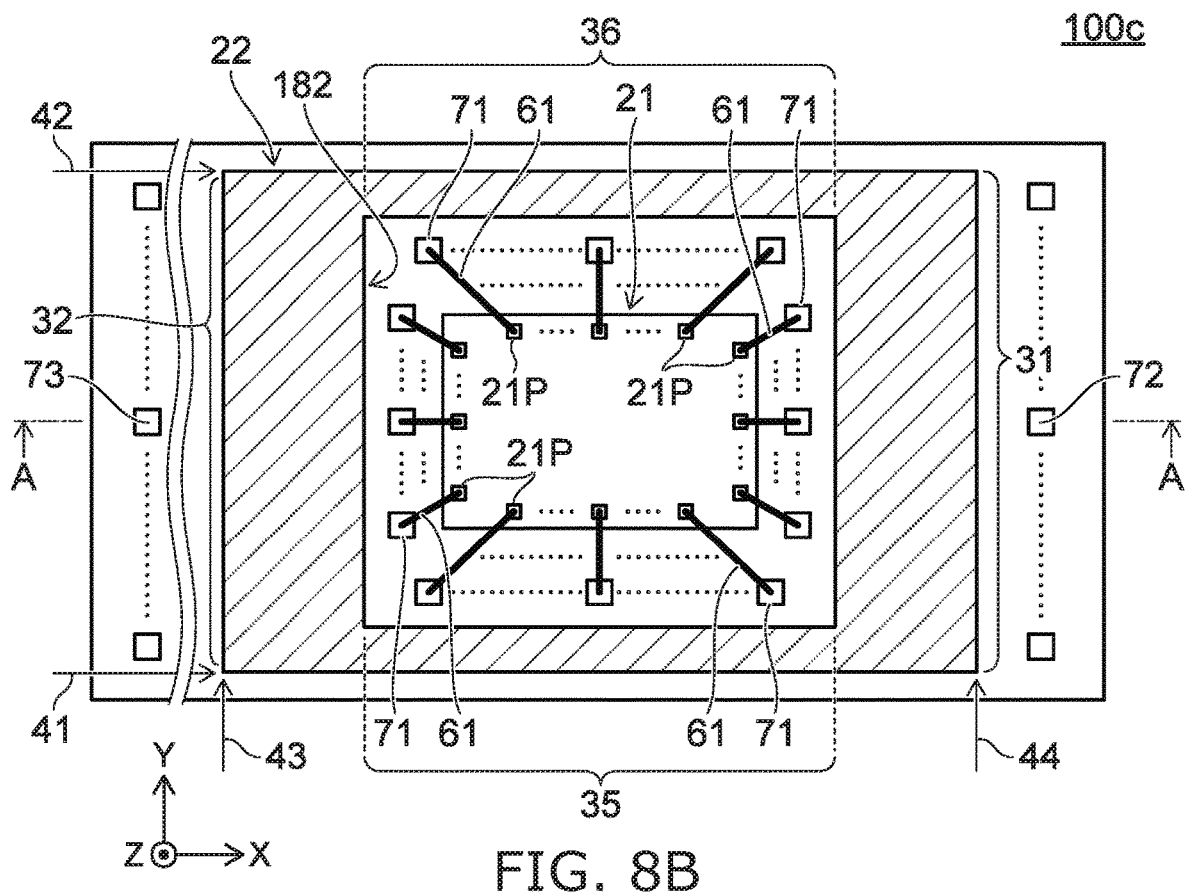
FIG. 8B is a schematic plan view illustrating the semiconductor device according to the third embodiment.

FIG. 8A is a schematic cross-sectional view illustrating a semiconductor device according to a third embodiment. FIG. 8B is a schematic plan view illustrating the semiconductor device according to the third embodiment. The base 1 and the semiconductor chips 21 and 22 are shown in FIG. 8A and FIG. 8B. In FIG. 8B, a portion of the semiconductor chip 22 is shown as a cross section. The cross section shown in FIG. 8B is along line B-B in FIG. 8A. The cross section shown in FIG. 8A is along line A-A in FIG. 7B.

As shown in FIG. 8A and FIG. 8B, compared to the semiconductor chip 22 of the first embodiment, the semiconductor chip 22 of the semiconductor device 100c according to the third embodiment further includes a portion 35 and a portion 36.

The portion 35 is continuous with the region 30, the portion 31, and the portion 32. The portion 36 is separated from the portion 35 in the Y-axis direction and is continuous with the region 30, the portion 31, and the portion 32. The portion 35 extends along the end surface 41 from the portion 31 to the portion 32. The portion 36 extends along the end surface 42 from the portion 31 to the portion 32.

The semiconductor chip 22 of the third embodiment has a recess 182 having the portions 31, 32, 35, and 36 as walls and the region 30 as a bottom. The semiconductor chip 22 is provided on the base 1 with the recess 182 oriented toward the base 1. According to the third embodiment, for example, a cavity between the region 30 and the base 1 is obtained. The semiconductor chip 21 is positioned inside the cavity on the base 1.

The semiconductor chip 22 may include, for example, a ring portion including the portions 31, 32, 35, and 36. For example, the ring portion is aligned with the end surfaces 41 to 44. According to the third embodiment, compared to, for example, the first and second embodiments, an advantage can be obtained in that the rigidity of the semiconductor chip 22 is increased further because the semiconductor chip 22 includes the ring portion.

The portions 31, 32, 35, and 36 may not contact the end surfaces 41 to 44. Also, in the third embodiment, for example, the insulative sealing member 8 may be filled or may not be filled into the cavity. In the case where the interior of the cavity is not filled with the insulative sealing member 8, the interior of the cavity is, for example, an air gap. Further, in the third embodiment, modifications similar to the third and fourth modifications of the first embodiment are possible. For example, in the third embodiment, in the case where the clearance 75 is provided, it is also possible for the clearance 75 to be, for example, an air gap filled with, for example, the insulative sealing member 8. However, to prevent discrepancies due to the expansion of the air by heating as well, it is desirable to seal the clearance 75 with an under-fill, an insulating resin material, etc. It is also possible to eliminate this circumstance by sealing in a vacuum.

Fourth Embodiment

FIG. 9A to FIG. 9G are schematic perspective views in order of the processes, illustrating a method for manufacturing a semiconductor device according to a fourth embodiment. FIG. 10A to FIG. 10H are schematic cross-sectional views in order of the processes, illustrating the method for manufacturing the semiconductor device according to the fourth embodiment. For example, the method for manufacturing the semiconductor chip 22 is illustrated in the fourth embodiment.

Figure 9A:
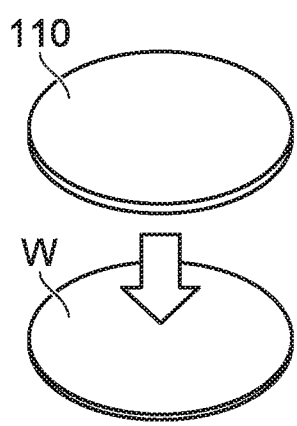

As shown in FIG. 9A and FIG. 10A, a silicon wafer W (called the wafer hereinbelow) is prepared in which the multiple semiconductor element portions D2 are formed. The wafer W has a first surface that includes the semiconductor element portions D2, and a second surface that is separated from the first surface in the Z-axis direction. Continuing, a surface protection tape 110 is bonded on the first surface of the wafer W.

Figure 9B:
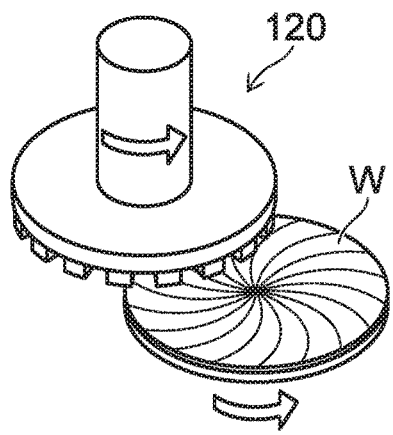

Then, as shown in FIG. 9B and FIG. 10B, the wafer W is inverted; and the second surface of the wafer W is caused to recede by polishing using a grinding wheel 120. This process is a so-called BSG (Back Side Grinding) process.

Figure 9C:
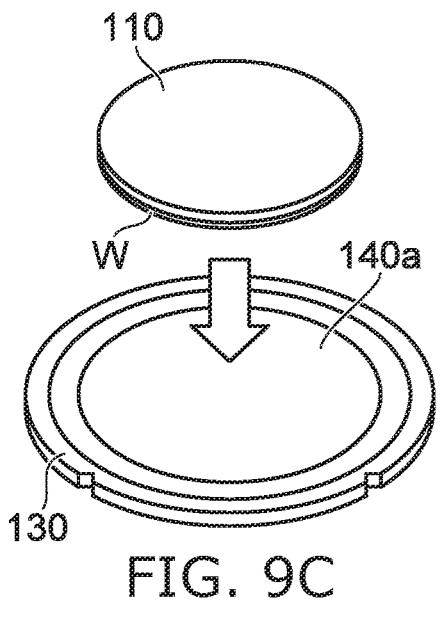

Continuing as shown in FIG. 9C and FIG. 10C, the wafer W is inverted; and the second surface of the wafer W is bonded to a bonding resin bonded on a dicing ring 130. One example of the bonding resin is a DAF (Die Attach Film) 140a. For example, the DAF 140a is bonded to a base material 140c by a bonding resin 140b. The base material 140c is, for example, a resin material such as PET (Poly Ethylene Terephthalate), etc.

Figure 9D:
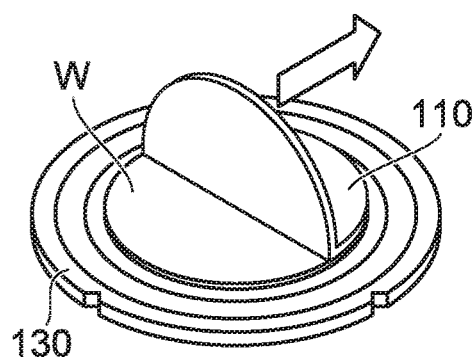

Then, as shown in FIG. 9D and FIG. 10D, the surface protection tape 110 is peeled from the first surface of the wafer W.

Figure 9E:
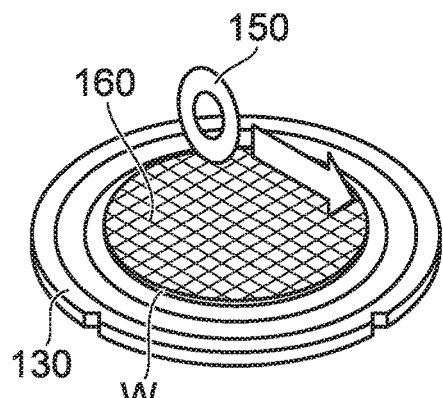

Continuing as shown in FIG. 9E and FIG. 10E, the wafer W is diced using a blade 150. A dicing line 160 is formed in the wafer W. The dicing line 160 is formed along each of the X-axis direction and the Y-axis direction. The wafer W is divided into the multiple semiconductor chips 22.

Figure 9F:
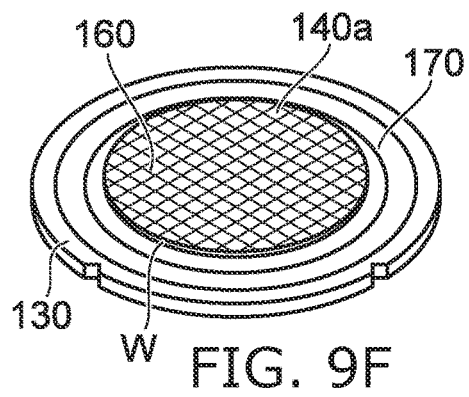

Then, as shown in FIG. 9F and FIG. 10F, for example, ultraviolet is irradiated; and the adhesive force of the bonding resin 140b is reduced. Continuing, the wafer W is inverted; and the first surface of the wafer W is bonded to a dicing tape 170 provided on the dicing ring 130. Continuing, for example, the bonding resin 140b and the base material 140c are peeled from the DAF 140a.

Figure 9G:
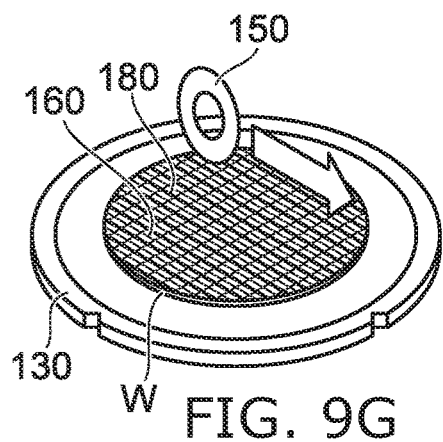

Continuing as shown in FIG. 9G and FIG. 10G, a recess is formed in the wafer W divided into the multiple semiconductor chips 22. In the embodiment, the trench 180 is formed in the wafer W. When forming the trench 180, for example, the blade 150 may pass through the wafer W several times along the Y-axis direction to cause the trench 180 to have the prescribed width.

Then, as shown in FIG. 10H, the semiconductor chips 22 are inverted; and the DAF 140a is bonded to a dicing tape 171. Subsequently, the adhesive force is reduced by irradiating ultraviolet on the dicing tape 171, etc.; and the semiconductor chips 22 are picked up from the dicing tape 171 and bonded on the base 1.

For example, the semiconductor chip 22 of the first embodiment can be manufactured by forming the trench 180 using, for example, the blade 150.

In the case where the semiconductor chip 22 of the second embodiment is manufactured, for example, it is sufficient to form the trench 181 having the cross pattern in the wafer W by forming trenches in each of the X-axis direction and the Y-axis direction in the process shown in FIG. 9G and FIG. 10G.

In the case where the semiconductor chip 22 of the third embodiment is manufactured, for example, it is sufficient to pre-form windows in the DAF 140a corresponding to the recesses 182, and to use the sheet in which the DAF is removed at the positions corresponding to the recesses 182. In such a case, the DAF is not formed at the positions corresponding to the recesses 182 even after the bonding resin 140b and the base material 140c are peeled from the DAF 140a. It is sufficient to subsequently form the recesses 182 in the wafer W by performing RIE, sand blasting, wet etching, etc., of the wafer W using the DAF 140a as an etching mask.

The method for manufacturing the semiconductor chip 22 in the second and third embodiments also is applied similarly to the fifth and sixth embodiments described below.

Fifth Embodiment

FIG. 11A to FIG. 11G are schematic perspective views in order of the processes, illustrating a method for manufacturing a semiconductor device according to a fifth embodiment. FIG. 12A to FIG. 12H are schematic cross-sectional views in order of the processes, illustrating the method for manufacturing the semiconductor device according to the fifth embodiment. For example, another method for manufacturing the semiconductor chip 21 is illustrated in the fifth embodiment.

Figure 11A:
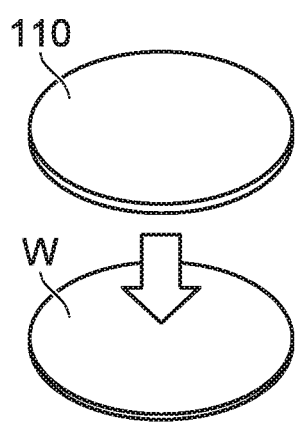
FIG. 11A to FIG. 12H are schematic perspective views in order of the processes, illustrating a method for manufacturing a semiconductor device according to a fifth embodiment.
Figure 11D:
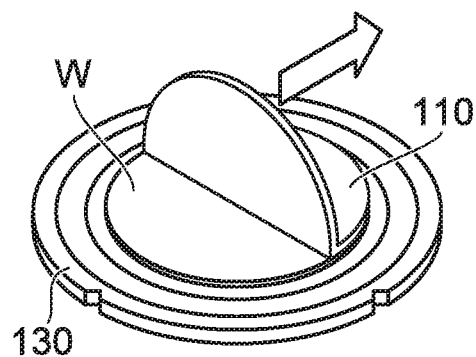
Figure 11B:
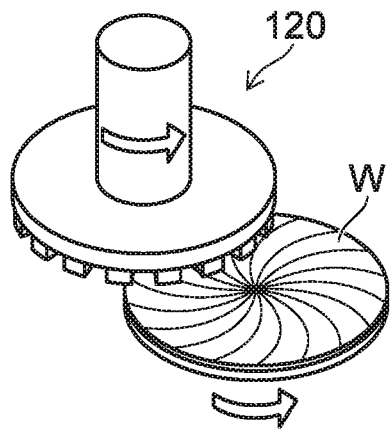
Figure 12A:
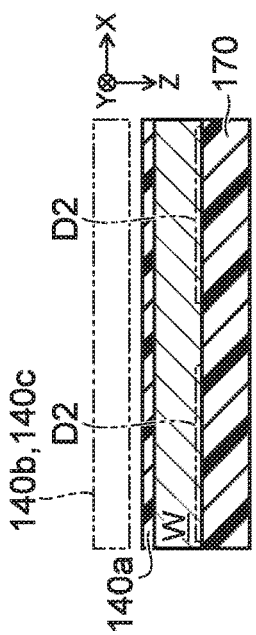
Figure 12B:
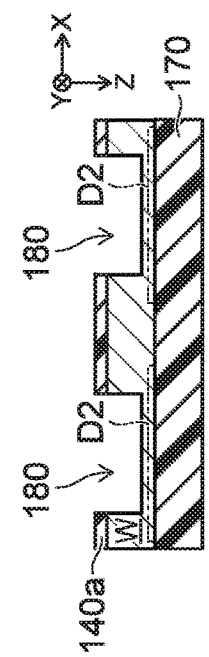
Figure 12C:
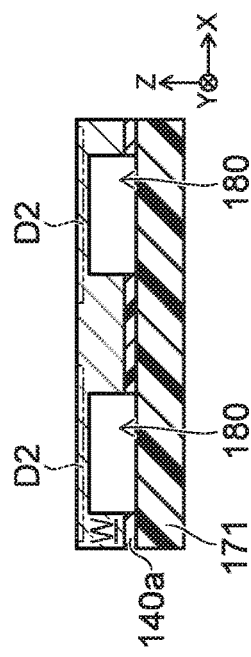
Figure 12D:
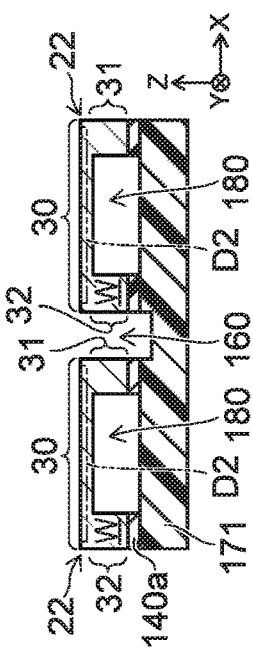

As shown in FIG. 11D and FIG. 12D, for example, the method of the fourth embodiment described with reference to FIG. 9A to FIG. 10D is used to polish the second surface of the wafer W, bond second surface of the wafer W to the DAF 140a, and peel the surface protection tape 110 from the first surface of the wafer W.

Figure 11E:
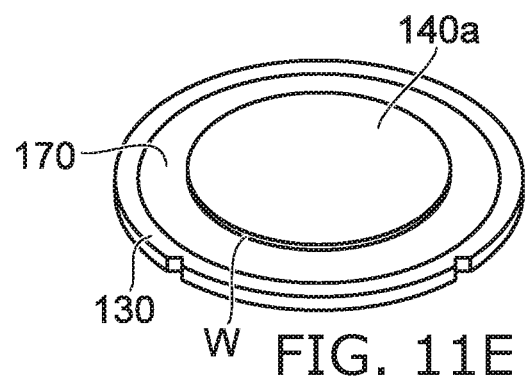
Figure 11C:
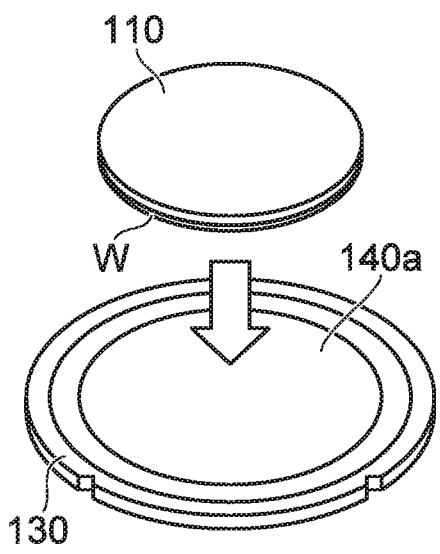
Figure 12E:
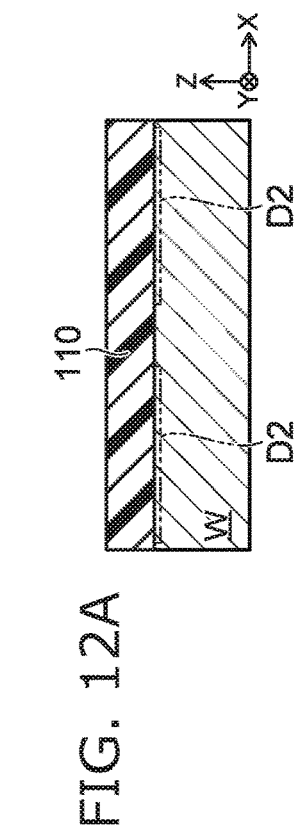

Then, as shown in FIG. 11E and FIG. 12E, the adhesive force of the bonding resin 140b is reduced by, for example, irradiating ultraviolet. Continuing, the wafer W is inverted; and the first surface of the wafer W is bonded to the dicing tape 170 provided on the dicing ring 130. Continuing, for example, the bonding resin 140b and the base material 140c are peeled from the DAF 140a.

Figure 11F:
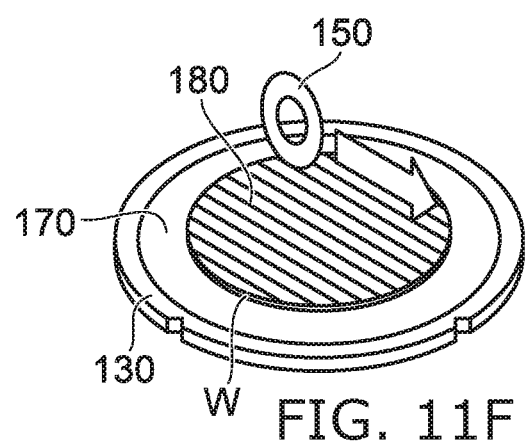
Figure 12F:
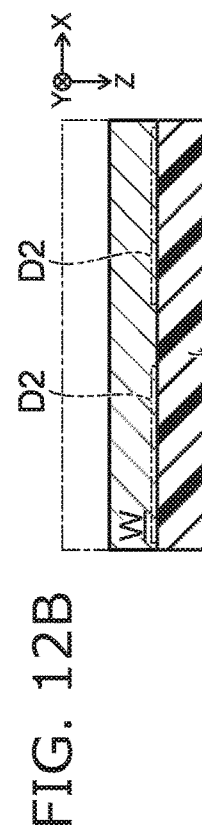

Continuing as shown in FIG. 11F and FIG. 12F, the trench 180 is formed in the wafer W by using the blade 150.

Figure 12G:
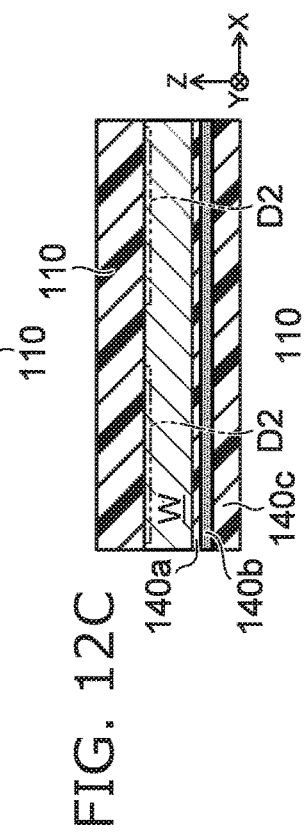

Then, as shown in FIG. 12G, the wafer W is inverted; and the DAF 140a is bonded to the dicing tape 171.

Figure 11G:
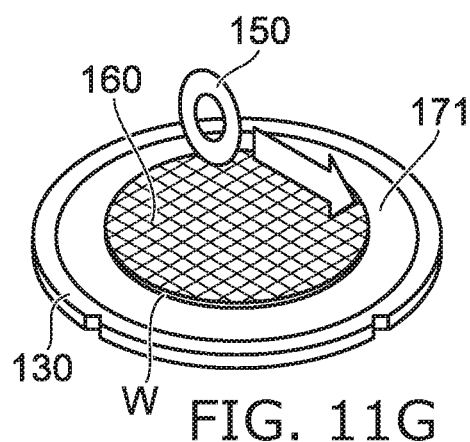
Figure 12H:
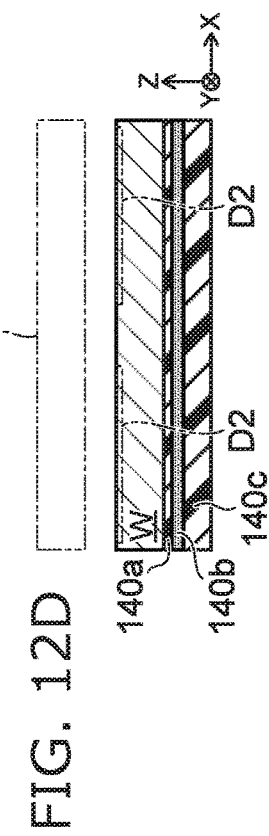

Continuing as shown in FIG. 11G and FIG. 12H, the wafer W is diced using the blade 150. The dicing line 160 is formed in the wafer W. Thereby, for example, the semiconductor chips 22 are obtained on the dicing tape 171. Subsequently, the semiconductor chips 22 are picked up from the dicing tape 171 and bonded on the base 1.

Thus, for example, it is also possible to form the trench 180 before the dicing line 160. According to the manufacturing method according to the fifth embodiment, the trench 180 is formed before dividing the wafer W into the semiconductor chips 22; therefore, for example, an advantage can be obtained in that the misalignment is small when forming the trench 180.

Fifth Embodiment: First Modification

Figure 13A:
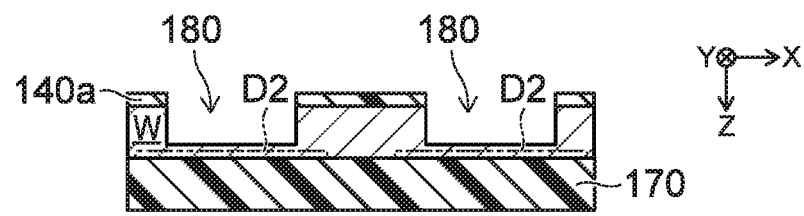
FIG. 13A to FIG. 13C are schematic cross-sectional views in order of the processes, illustrating a method for manufacturing a semiconductor device according to a first modification of the fifth embodiment.
Figure 13B:
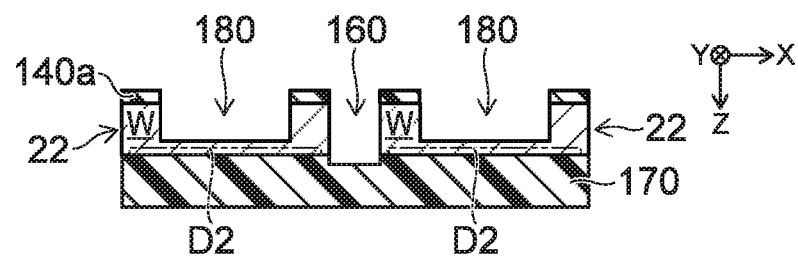
Figure 13C:
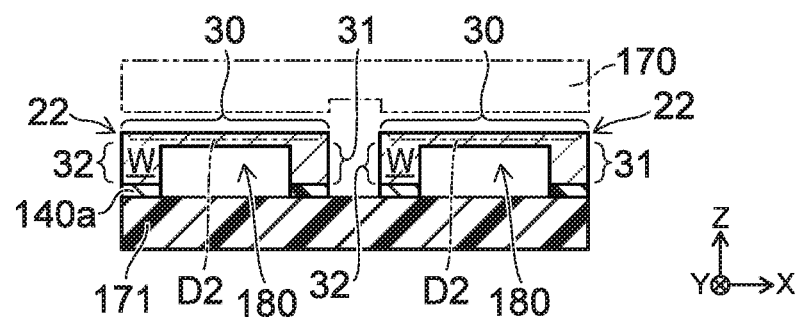

FIG. 13A to FIG. 13C are schematic cross-sectional views in order of the processes, illustrating a method for manufacturing a semiconductor device according to a first modification of the fifth embodiment.

As shown in FIG. 13A, for example, the method of the fifth embodiment described with reference to FIG. 11A to FIG. 12F is used to form the trench 180 in the wafer W on the dicing tape 170 by using a blade.

Then, as shown in FIG. 13B, the dicing line 160 is formed in the wafer W on the dicing tape 170 by using a blade. Thereby, for example, the semiconductor chips 22 are obtained on the dicing tape 170.

Continuing as shown in FIG. 13C, the wafer W is inverted; and the DAF 140a is bonded to the dicing tape 171. Continuing, the dicing tape 170 is peeled from the element formation surface. Subsequently, the semiconductor chips 22 are picked up from the dicing tape 171 and bonded on the base 1.

Thus, it is also possible to form the dicing line 160 without inverting the wafer W.

In the case where the trench 180 is formed using a blade, it is also possible to form the trench 180 in the same process as the dicing line 160. In other words, the formation process of the trench 180 shown in FIG. 13A and the dicing process shown in FIG. 13B are performed simultaneously. By changing the depth of the blade passing through the wafer W, the trench 180 and the dicing line 160 can be made individually. For example, when forming the trench 180, the blade 150 passes shallowly through the wafer W not to divide the wafer W; and when forming the dicing line 160, the blade 150 passes deeply through the wafer W to divide the wafer W. Thereby, the trench 180 and the dicing line 160 can be formed in the same process.

The trench 181 also can be formed in the dicing process. Also, it is possible to form the recess 182 with the dicing line 160 in the dicing process by, for example, modifying a tool such as the blade, etc.

Thus, the process of forming the trench 180 or 181 or the recess 182 in each of the multiple semiconductor chips can be performed in at least one of the following (a) to (c):

(a) Before the process of dividing the wafer W into the multiple semiconductor chips;

(b) After the process of dividing the wafer W into the multiple semiconductor chips; or (c) In the process of dividing the wafer W into the multiple semiconductor chips.

Sixth Embodiment

FIG. 14A to FIG. 14G are schematic perspective views in order of the processes, illustrating a method for manufacturing a semiconductor device according to a sixth embodiment. FIG. 15A to FIG. 15H are schematic cross-sectional views in order of the processes, illustrating the method for manufacturing the semiconductor device according to the sixth embodiment. For example, a method for manufacturing the semiconductor chip 22 is illustrated in the sixth embodiment.

Figure 14A:
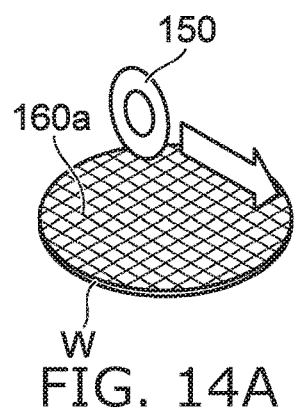

As shown in FIG. 14A and FIG. 15A, by using the blade 150, a half-cut trench 160a is formed in the first surface of the silicon wafer W in which the multiple semiconductor element portions D2 are formed. The half-cut trench 160a is formed along each of the X-axis direction and the Y-axis direction. For example, the depth in the Z-axis direction of the half-cut trench 160a is set to a depth that is not less than the thickness (the final thickness, i.e., the finished thickness) in the Z-axis direction of the semiconductor chip 22.

Figure 14B:
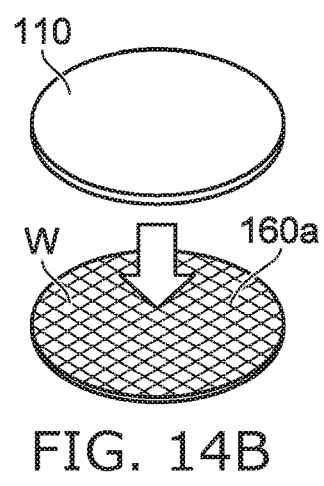

Then, as shown in FIG. 14B and FIG. 15B, the surface protection tape 110 is bonded on the first surface of the wafer W in which the half-cut trench 160a is formed.

Figure 14C:
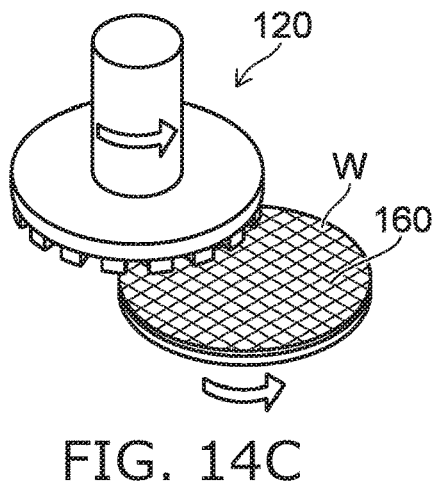

Continuing as shown in FIG. 14C and FIG. 15C, the wafer W is inverted; and the second surface of the wafer W is caused to recede by polishing using the grinding wheel 120. The wafer W is divided into the multiple semiconductor chips 22. In other words, the sixth embodiment is an example using so-called DBG (Dicing Before Grinding) in which the dicing process is performed before the BSG process.

Figure 14D:
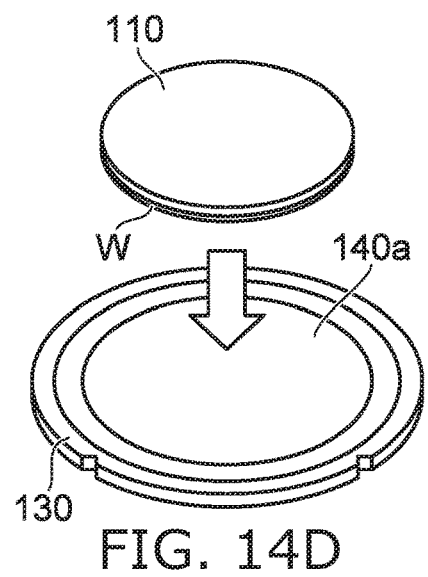

Then, as shown in FIG. 14D and FIG. 15D, the wafer W is inverted; and the second surface of the wafer W is bonded to a bonding resin, e.g., the DAF 140a bonded on the dicing ring 130.

Figure 14E:
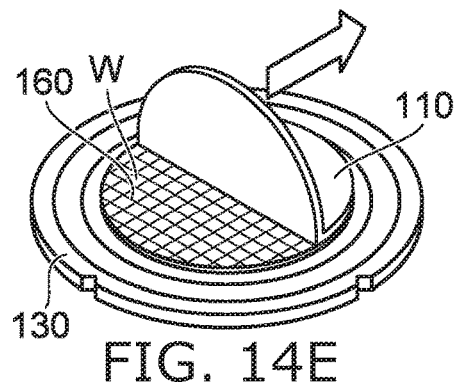

Continuing as shown in FIG. 14E and FIG. 15E, the surface protection tape 110 is peeled from the first surface of the wafer W.

Figure 14F:
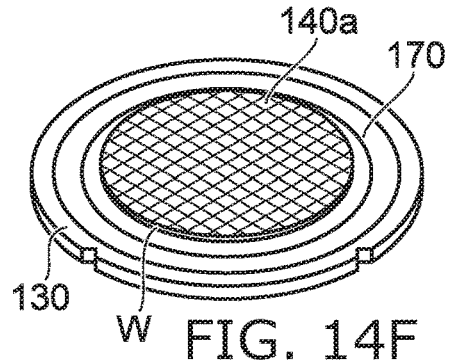

Then, as shown in FIG. 14F and FIG. 15F, the adhesive force of the bonding resin 140b is reduced; subsequently, the wafer W is inverted; and the first surface of the wafer W is bonded to the dicing tape 170. Continuing, the bonding resin 140b and the base material 140c are peeled from the DAF 140a.

Figure 14G:
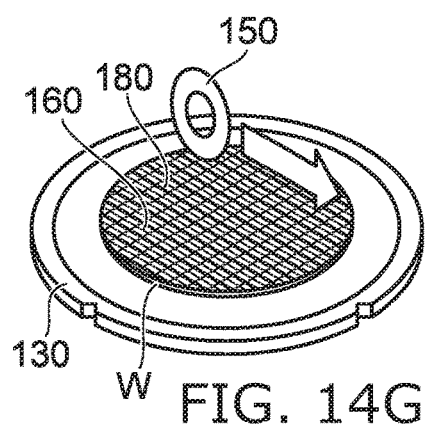

Continuing as shown in FIG. 14G and FIG. 15G, a recess is formed in the wafer W divided into the multiple semiconductor chips 22. In the embodiment, the trench 180 is formed in the wafer W by using, for example, the blade 150. Continuing, the DAF 140a is divided for each of the multiple semiconductor chips 22 by cutting the DAF 140a. For example, it is sufficient to use a laser 151 to cut the DAF 140a. The cutting of the DAF 140a by the laser 151 may be performed in the process shown in FIG. 15E.

Then, as shown in FIG. 15H, the semiconductor chips 22 are inverted; and the DAF 140a is bonded to the dicing tape 171. Subsequently, the semiconductor chips 22 are picked up from the dicing tape 171 and bonded on the base 1.

As in the sixth embodiment, it is also possible to use DBG to perform the dicing of the wafer W.

Seventh Embodiment

Figure 16:
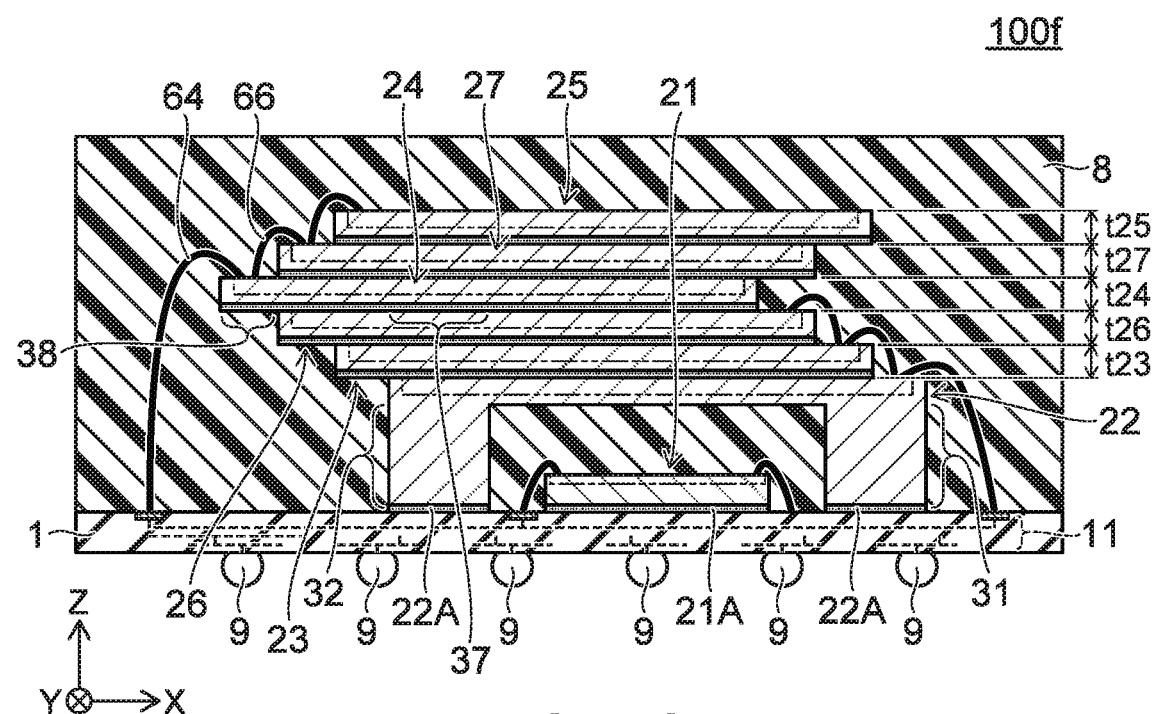
FIG. 16 is a schematic cross-sectional view illustrating a semiconductor device according to a seventh embodiment.

FIG. 16 is a schematic cross-sectional view illustrating a semiconductor device according to a seventh embodiment.

As shown in FIG. 16, the semiconductor device 100f according to the sixth embodiment is an example in which thicknesses t23 to t27 in the Z-axis direction of the semiconductor chips 23 to 27 are equal to each other.

In the semiconductor device according to the embodiment, for example, the multiple semiconductor chips are stacked while being shifted in the X-axis direction, and stacked further in the reverse orientation partway through the stacking direction. For example, in the semiconductor device 100f according to the seventh embodiment, the stacking direction is changed to the reverse orientation at the semiconductor chip 24. The semiconductor chip 24 has a configuration like, for example, a "cantilever beam" with respect to the semiconductor chips 22, 23, and 25 to 27 stacked in the Z-axis direction. The semiconductor chip 24 includes a portion 37 that overlaps at least one of the portion 31 or 32, and a portion 38 that overhangs from the semiconductor chip 22.

For example, in the case where the insulating resin material 300 such as that of the semiconductor device 100r according to the reference example described with reference to FIG. 4A is used, the insulating resin material 300 has a low elastic modulus; therefore, for example, micro flexing and "vibrations" accompanying the micro flexing occur easily due to impact of the wire bonding. In particular, for the semiconductor chip 24 having the configuration like a "cantilever beam," a space widens between the portion 38 and the base 1 of the semiconductor chip 24 in the wire bonding. Moreover, the pad electrode 24P (referring to FIG. 3A) is disposed in the portion 38. Therefore, the "flexing" and/or the "vibrations" occur particularly easily at the semiconductor chip due to the impact of the wire bonding. In the semiconductor chip 24, the portion 38 flexes and vibrates particularly easily.

There is a possibility that the "flexing" and/or the "vibrations" of the semiconductor chip 24 may reduce the precision and/or the bonding strength of the wire bonding. For example, in the case where the semiconductor chip 24 flexes or vibrates, the application of the bonding energy to the interconnect member 64 and the pad electrode 24P in the wire bonding easily becomes insufficient. Therefore, there are circumstances in which it is difficult to obtain a sufficient bonding strength between the interconnect member 64 and the pad electrode 24P. To suppress such a decrease of the precision of the wire bonding, the thickness of the semiconductor chip having the configuration like a "cantilever beam," e.g., a thickness t24 in the Z-axis direction of the semiconductor chip 24 is set to be thicker than the thickness in the Z-axis direction of the other semiconductor chips.

In the semiconductor device 100f according to the seventh embodiment, the semiconductor chip of the lowermost layer of the stack is the semiconductor chip 22. For example, the rigidity of the semiconductor chip 22 is high compared to that of the insulating resin material 300 (referring to FIGS. 3A and 3B). Moreover, for example, the portion 37 of the semiconductor chip 24 is positioned on the portion 32 in the Z-axis direction. Therefore, for example, compared to the semiconductor device 100r according to the reference example (referring to FIGS. 3A and 3B), the flexing and the vibrations accompanying the flexing do not occur easily in the semiconductor chip 24. Accordingly, it is also possible to set the thickness t24 to be thin. Of course, for example, the thickness t24 may be thicker than the thicknesses t23 and t25 t27.

For example, in the seventh embodiment, the thickness t24 is set to the same as, for example, the thicknesses t23 and t25 to t27 in the Z-axis direction of the semiconductor chips 23 and 25 to 27. Although the thicknesses t23 to t27 are set to have the same thickness, it is unnecessary for the thicknesses to be strictly the same thickness. For example, errors within the range of tolerances are included in the thicknesses t23 to t27.

According to the seventh embodiment, for example, the thicknesses t23 to t27 in the Z-axis direction of the semiconductor chips 23 to 27 can be equal to each other while suppressing the vibrations of the semiconductor chips that may occur in the wire bonding. Thereby, even more of a thickness reduction of the package can be realized.

Eighth Embodiment

Figure 17A:
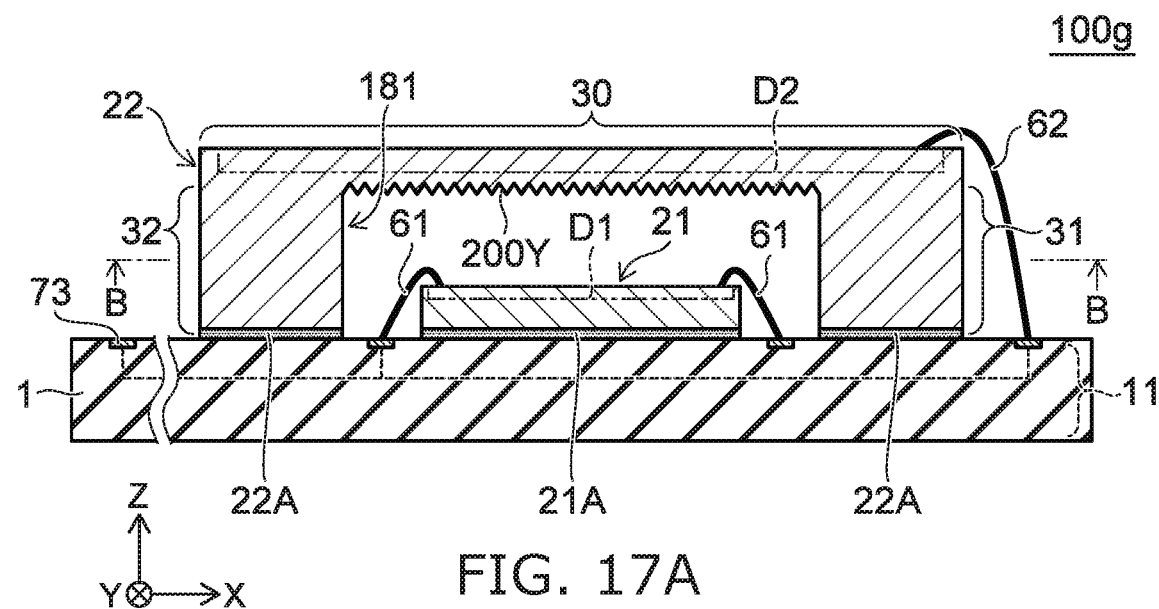
FIG. 17A is a schematic cross-sectional view illustrating a semiconductor device according to an eighth embodiment.
Figure 17B:
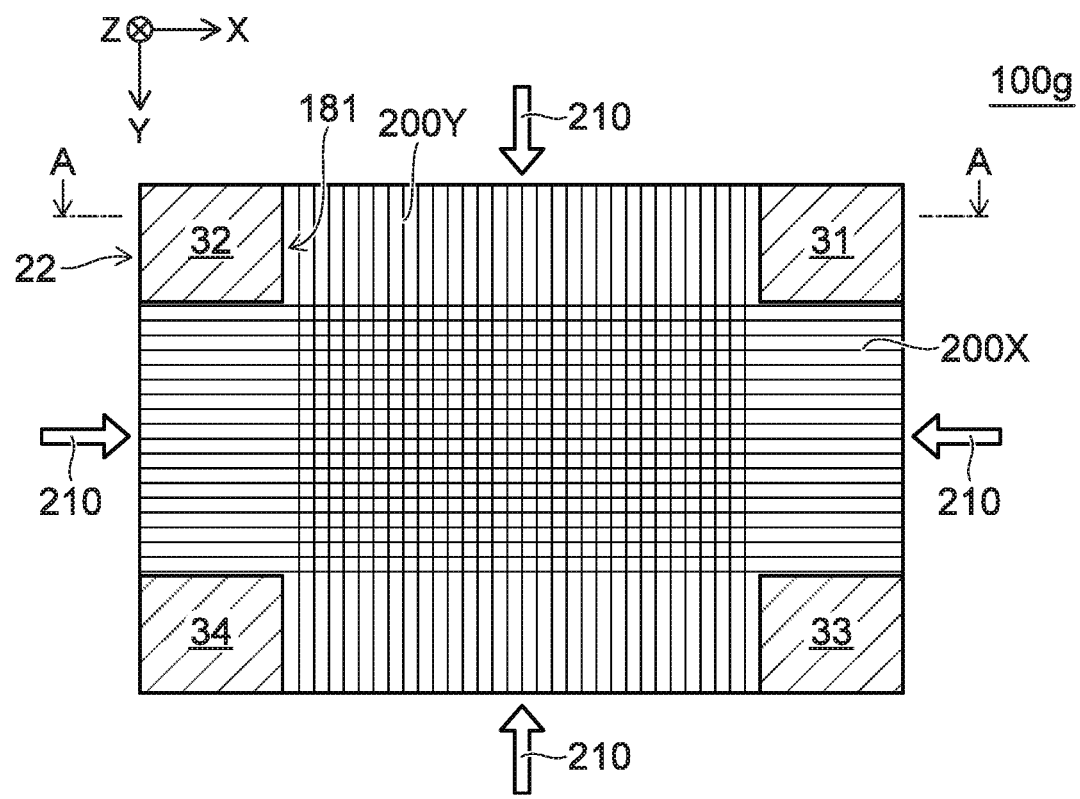
FIG. 17B is a schematic plan view illustrating the semiconductor device according to the eighth embodiment.

FIG. 17A is a schematic cross-sectional view illustrating a semiconductor device according to an eighth embodiment. FIG. 17B is a schematic plan view illustrating the semiconductor device according to the eighth embodiment. The base 1 and the semiconductor chips 21 and 22 are shown in FIG. 17A. In FIG. 17B, the semiconductor chip 22 is shown; and a portion of the semiconductor chip 22 is shown as a cross section. The cross section shown in FIG. 17B is along line B-B in FIG. 17A. FIG. 17B is a drawing in which the semiconductor chip 22 is viewed along the Z-axis direction from the base 1 side toward the region 30; the portions 31 to 34 each are shown as cross sections; and the back surface of the region 30 is shown as a plane. The cross section shown in FIG. 17A is along line A-A in FIG. 17B.

As shown in FIG. 17A and FIG. 17B, the semiconductor device 100g according to the eighth embodiment is, for example, an example in which notches 200X and 200Y are provided in the trench 181 of the semiconductor chip 22 of the second embodiment. In the semiconductor chip 22 of the first embodiment, for example, the notches 200Y are provided in the trench 180. For example, the notches 200X and 200Y are provided in the bottom surface of the region 30. The bottom surface is the surface positioned opposite to the surface where the semiconductor element portion D2 is formed. The notches 200X extend in the X-axis direction. The notches 200Y extend in the Y-axis direction.

Although described in the fourth to sixth embodiments, the trench 180 is formed by the blade 150 passing through the wafer W several times along the Y-axis direction. Also, the trench 181 is formed by the blade 150 further passing through the wafer W multiple times along the X-axis direction.

Figure 18A:
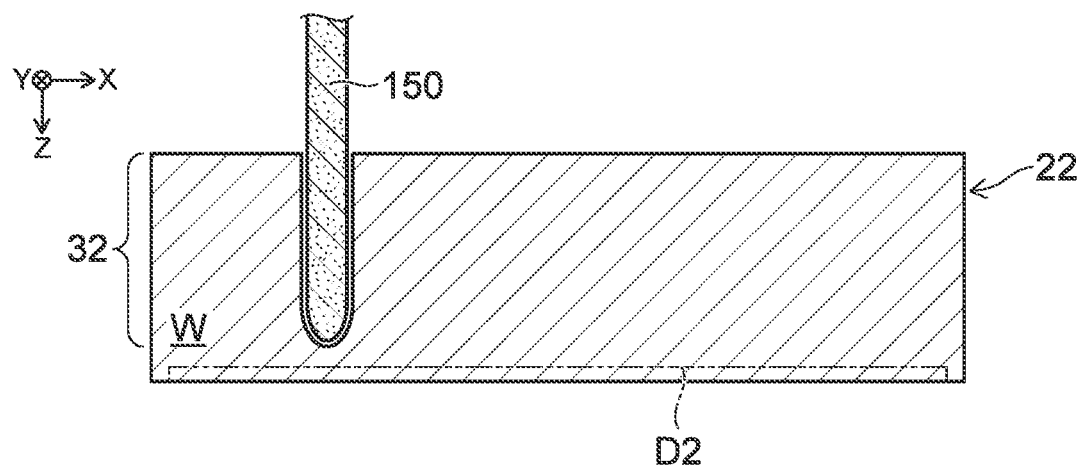
FIG. 18A to FIG. 18C are schematic cross-sectional views in order of the processes, illustrating one of the manufacturing methods that manufacture the semiconductor device according to the eighth embodiment.
Figure 18B:
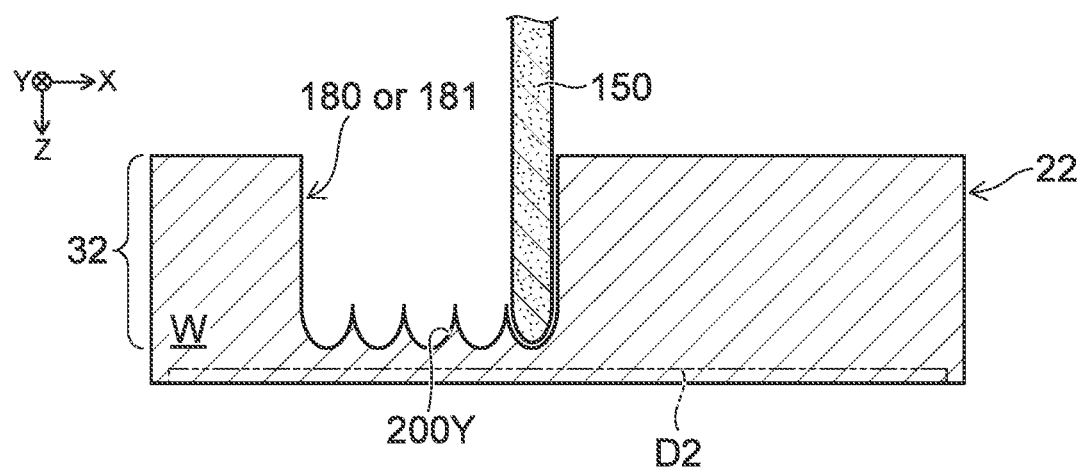
Figure 18C:
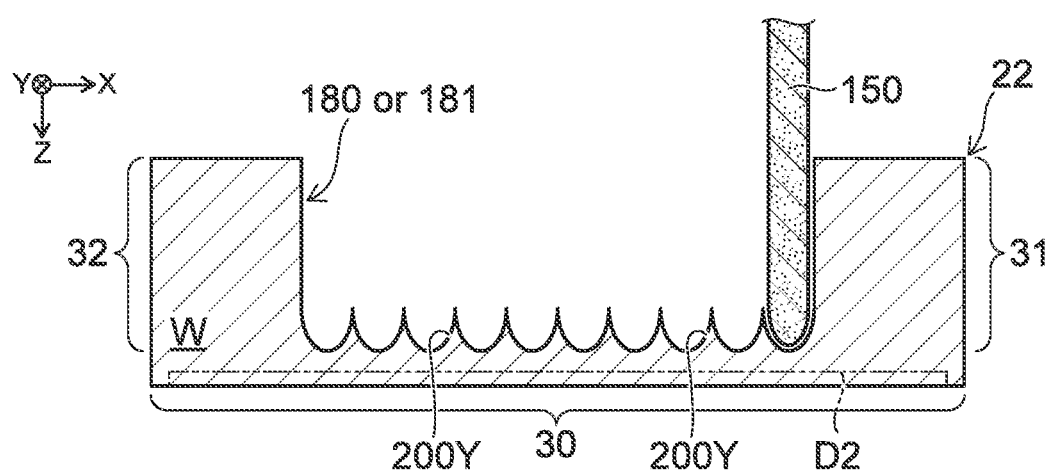

FIG. 18A to FIG. 18C are schematic cross-sectional views in order of the processes, illustrating one of the manufacturing methods that manufacture the semiconductor device according to the eighth embodiment.

As shown in order in FIG. 18A to FIG. 18C, for example, the trench 180 or 181 is formed by causing the blade 150, of which the blade tip has an elliptical configuration or a tapered configuration, to pass through the wafer W multiple times. In such a method for forming the trench 180 or 181, the notches 200X or 200Y are formed in the semiconductor chip 22 or the wafer W each time the blade 150 passes through the wafer W.

Thus, the trench 180 or the trench 181 is formed by using the blade 150 of which the blade tip has an elliptical configuration or a tapered configuration, and by causing the blade 150 to pass through the wafer W multiple times. Thereby, the notches 200X or 200Y can be formed after forming the trench 180 or the trench 181 without adding a process.

The tip of the blade 150 easily becomes fine due to the wear when grinding, etc. Therefore, the trench 180 and/or the trench 181 may have a tapered configuration that is finer toward the bottom portion.

According to the semiconductor device 100g according to the eighth embodiment, the notches 200X along the X-axis direction and the notches 200Y along the Y-axis direction are provided in the trench 181 of the semiconductor chip 22. For example, the notches 200X and 200Y can function as "guides" that guide the insulating resin used to form the insulative sealing member 8 into the recess. Arrows 210 of FIG. 17B show the flow of the insulating resin.

According to the semiconductor device 100g, for example, an advantage can be obtained in that the insulative sealing member 8 is filled easily into the recess obtained between the region 30 and the base 1 when the semiconductor chips 21 to 27 are insulatively sealed with the insulative sealing member 8.

Further, compared to the case where the notches 200X or 200Y are not provided, the insulative sealing member 8 after curing is closely adhered more securely to the semiconductor chip 22 inside the recess (an anchor effect). Accordingly, advantages also can be obtained in that the adhesion between the insulative sealing member 8 and the semiconductor chip 22 improves; and the peeling of the insulative sealing member 8 can be suppressed.

Ninth Embodiment

FIG. 19A to FIG. 21B are schematic cross-sectional views in order of the processes, illustrating a method for manufacturing a semiconductor package according to a ninth embodiment.

Figure 19A:
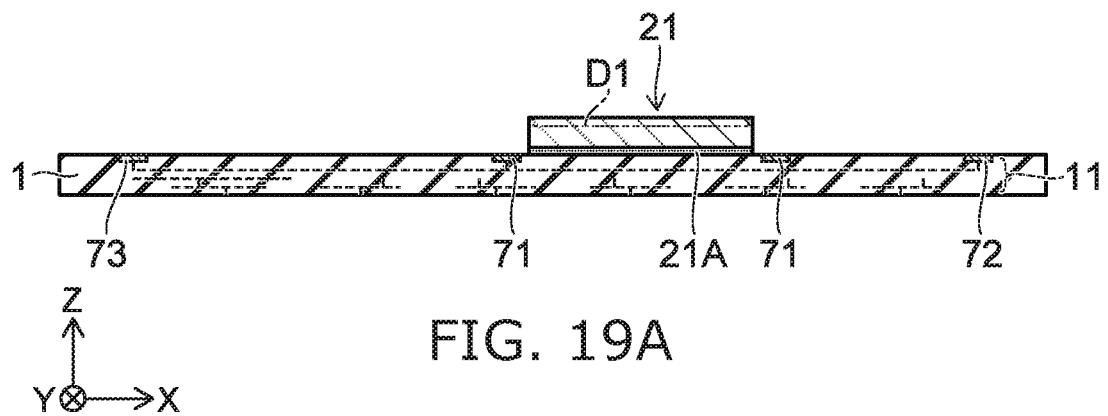
FIG. 19A to FIG. 21B are schematic cross-sectional views in order of the processes, illustrating a method for manufacturing a semiconductor package according to a ninth embodiment.

As shown in FIG. 19A, the semiconductor chip 21 is bonded on the base 1. The base 1 includes the interconnect group 11 including multiple interconnects. The semiconductor chip 21 includes the semiconductor element portion D1, and the pad electrodes 21P electrically connected to the semiconductor element portion D1 (for the pad electrodes 21P, refer to FIG. 2B).

Figure 19B:
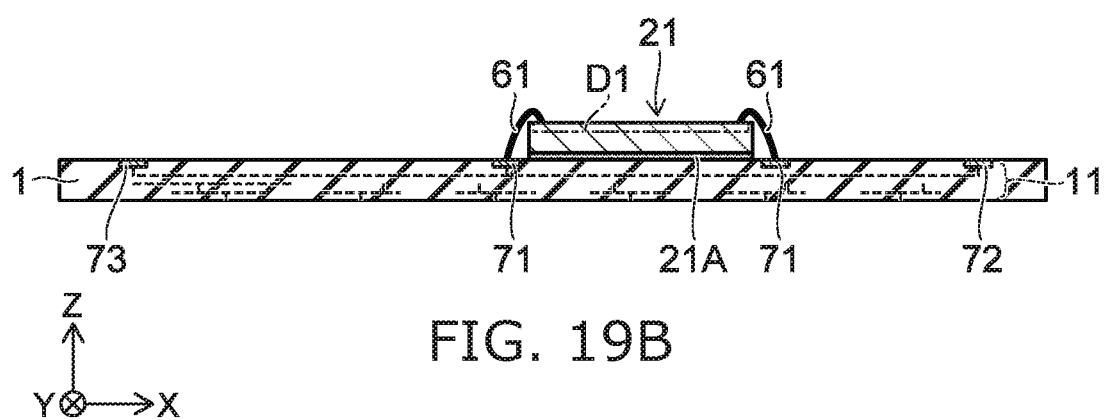

Then, as shown in FIG. 19B, the interconnects included in the interconnect group 11 and the pad electrodes 21P are electrically connected. The interconnects are electrically connected to the terminal electrodes 71. For example, the terminal electrodes 71 and the pad electrodes 21P are electrically connected by the interconnect members 61. The connection method may be a wire bonding method using bonding wires such as those illustrated, or may be a flip chip method using bump electrodes.

Figure 20A:
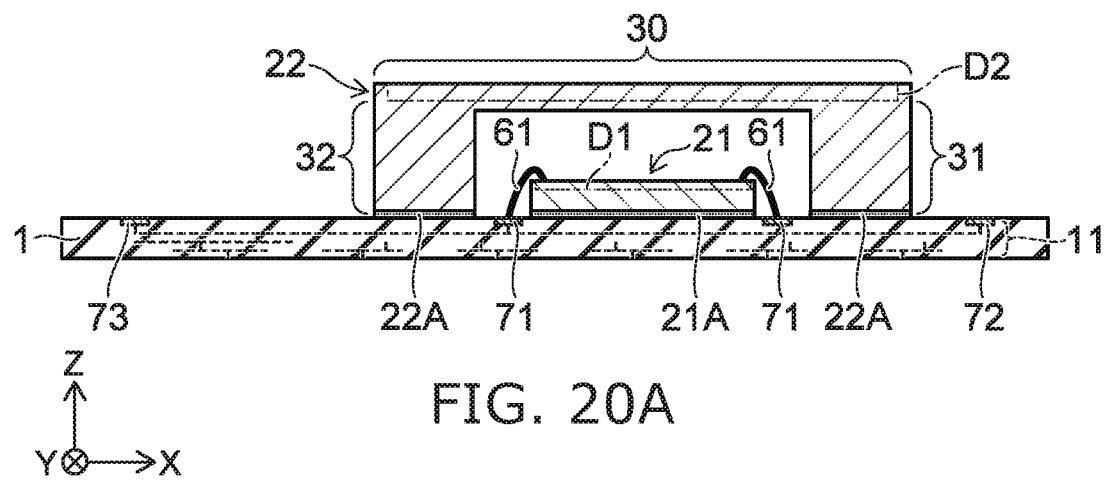

Continuing as shown in FIG. 20A, the semiconductor chip 22 that includes the pad electrode 22P (referring to FIG. 3A and FIG. 3B) is bonded on the base 1. The semiconductor chip 22 is bonded on the base 1 so that the semiconductor chip 21 is surrounded with the base 1, the region 30, the portion 31, and the portion 32.

Figure 20B:
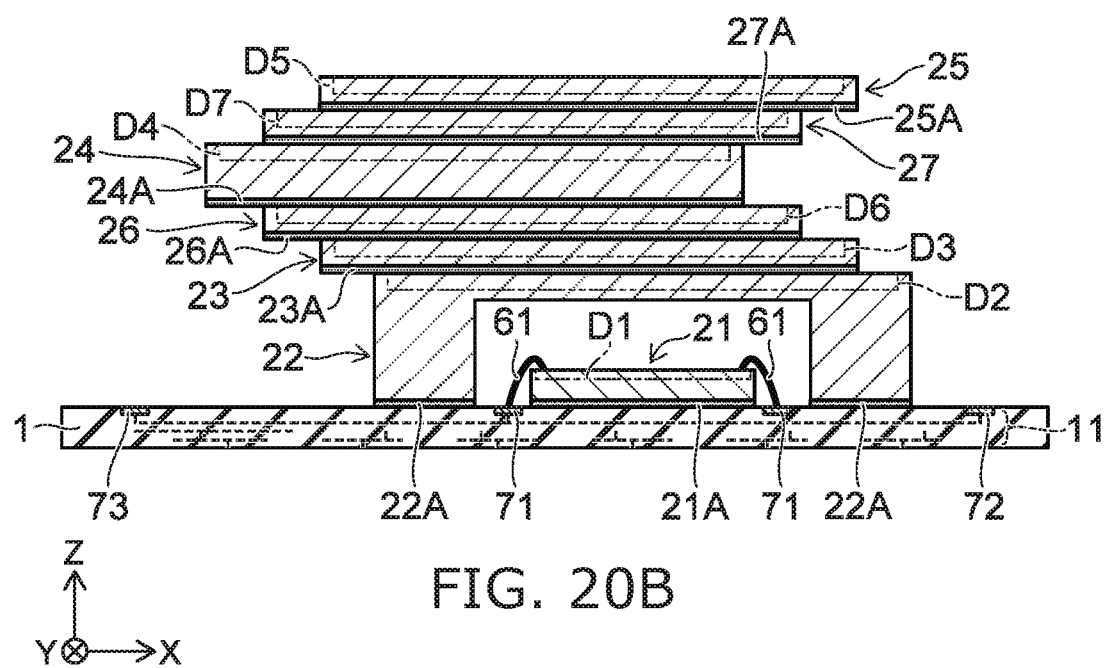

Then, as shown in FIG. 20B, the multiple semiconductor chips that include pad electrodes, e.g., the semiconductor chips 23 to 27 that respectively include the pad electrodes 23P to 27P (referring to FIG. 3A) are bonded on the semiconductor chip 22. When bonding, the bonding is performed so that the pad electrodes 22P to 27P are exposed.

Figure 21A:
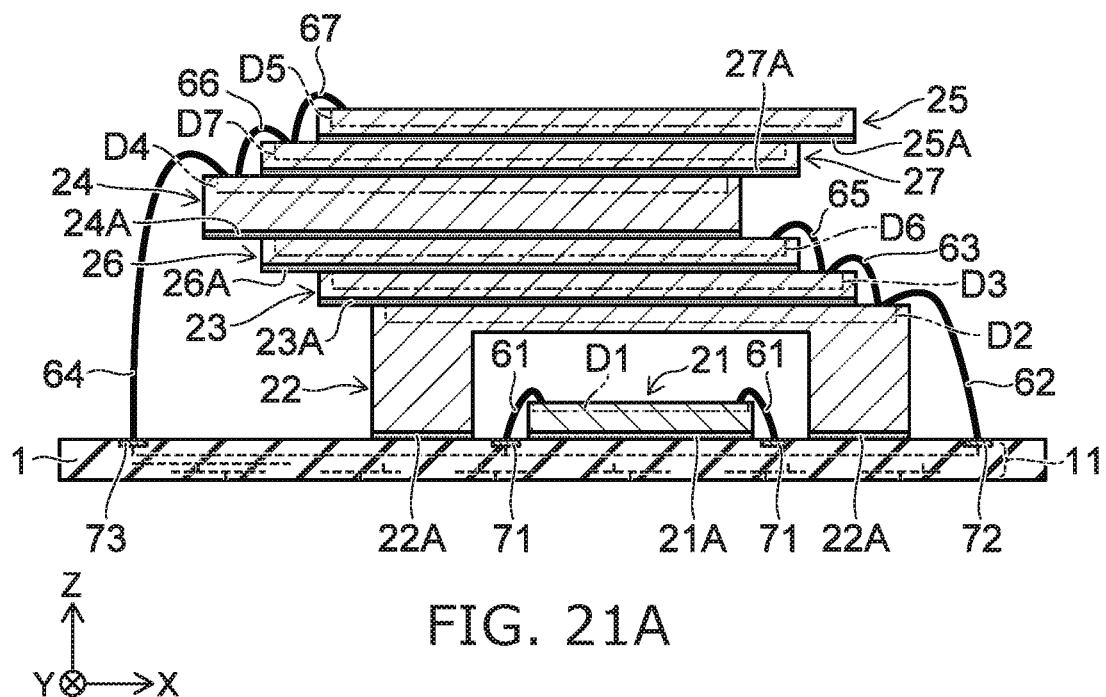

As shown in FIG. 21A, the interconnects included in the interconnect group 11 and the pad electrodes 22P to 27P are electrically connected. The interconnects are electrically connected to the terminal electrodes 72 and 73. For example, the terminal electrode 72, the terminal electrode 73, and the pad electrodes 22P to 27P are electrically connected by the interconnect members 62 to 67. This connection also is not limited to the wire bonding method that is illustrated and may be a flip chip method.

To prevent the interference between the semiconductor chips and the bonding tool of the bonding apparatus, for example, the process (the die mount) shown in FIG. 20B and the process (the wire bonding) shown in FIG. 21A may be performed as follows:

(1) Die mounting of the semiconductor chips 22, 23, and 26;

(2) Wire bonding of the interconnect members 62, 63, and 65;

(3) Die mounting of the semiconductor chips 24, 27, and 25; and (4) Wire bonding of the interconnect members 64, 66, and 67.

By performing the die mount and the wire bonding in the order of (1) to (4) recited above, the interference between the bonding tool and the semiconductor chips can be prevented.

Figure 21B:
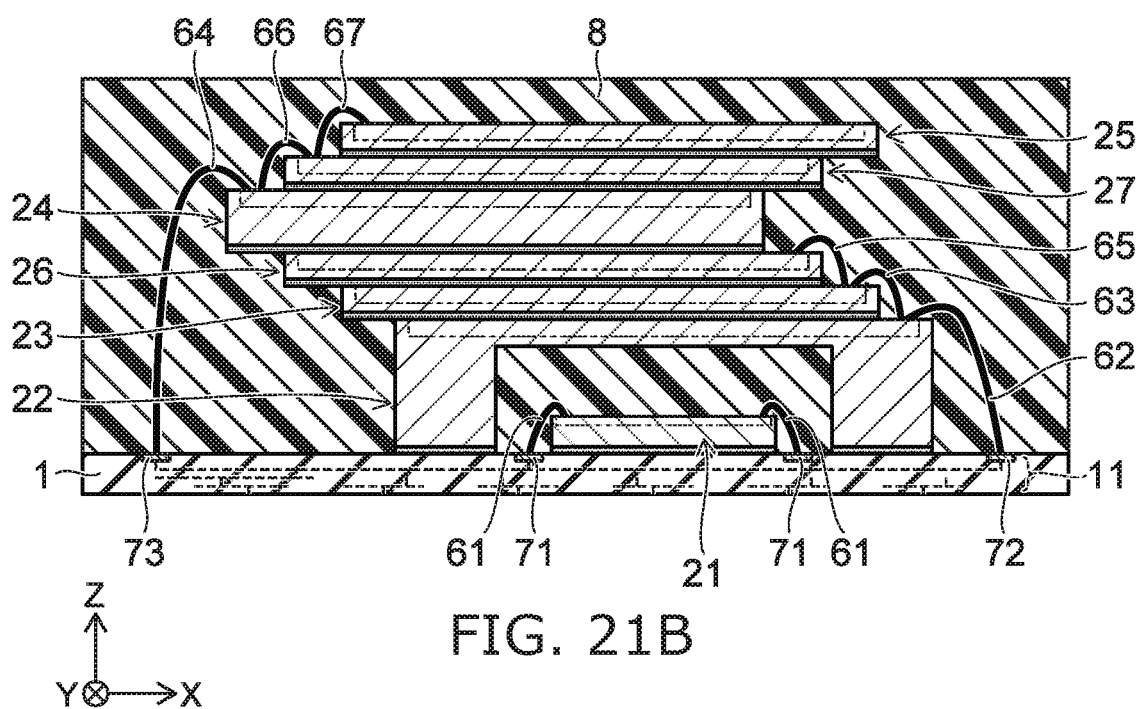

Then, as shown in FIG. 21B, the insulative sealing member 8 is used to seal at least the semiconductor chips 22 to 27 on at least the base 1. In the ninth embodiment, an example is shown in which the semiconductor chip 21 also is sealed with the insulative sealing member 8. After the sealing with the insulative sealing member 8, a design (not illustrated) such as a model number or the like is printed on the front surface of the insulative sealing member 8.

Then, as shown in FIG. 1B, the external terminals 9 are formed at the base 1. The external terminals 9 are, for example, bump electrodes. By, for example, processes such as these, a semiconductor package is manufactured in which the semiconductor device according to the embodiment is sealed.

Tenth Embodiment

Figure 22A:
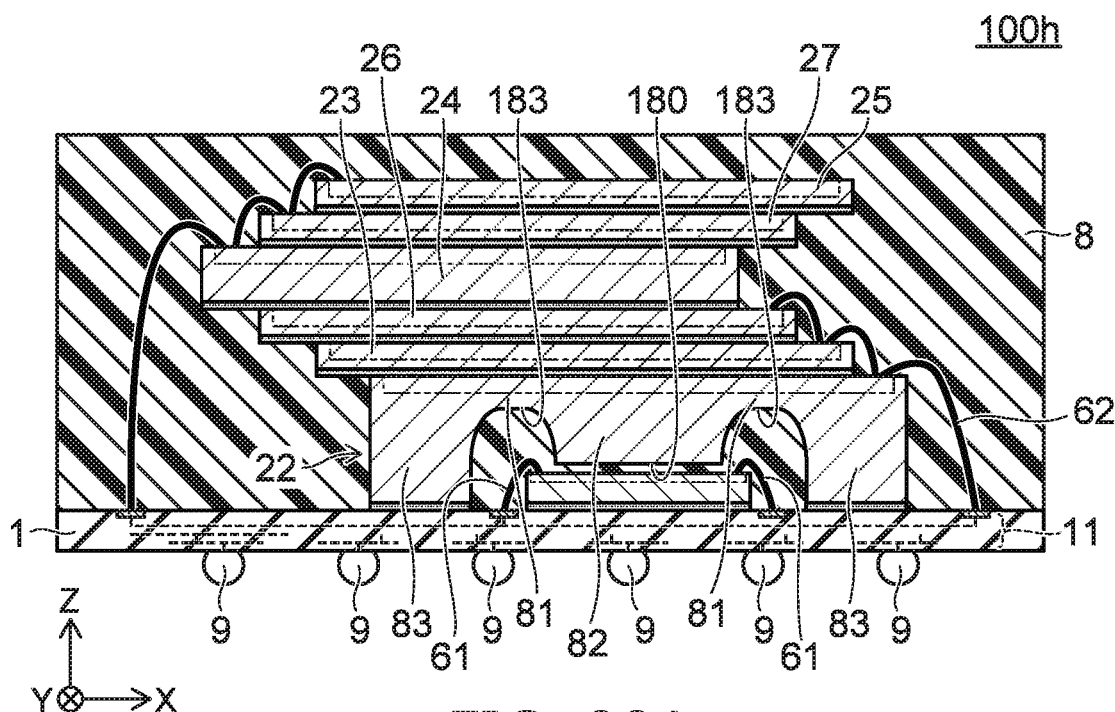
FIG. 22A is a schematic cross-sectional view illustrating a semiconductor package according to a tenth embodiment.
Figure 22B:
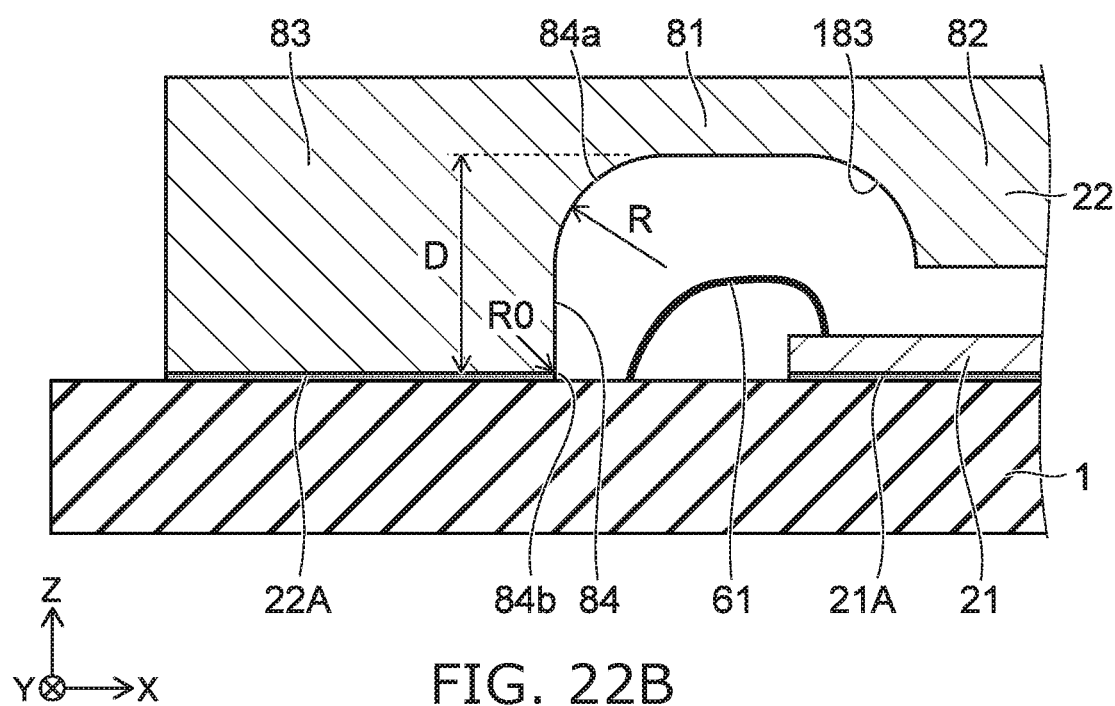
FIG. 22B is a partially enlarged cross-sectional view of FIG. 22A.
Figure 23:
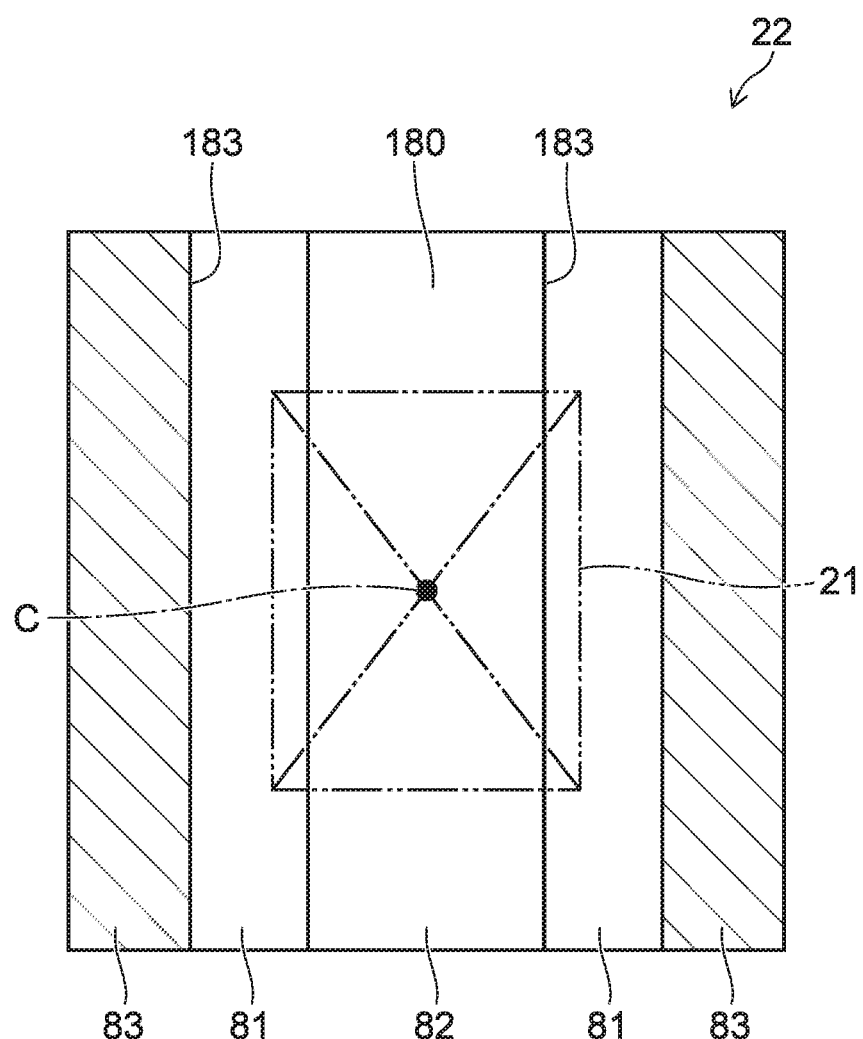
FIG. 23 is a schematic plan view illustrating the semiconductor chip of the tenth embodiment.

FIG. 22A is a schematic cross-sectional view illustrating a semiconductor package according to a tenth embodiment; and FIG. 22B is a partially enlarged cross-sectional view of FIG. 22A. FIG. 23 is a schematic plan view illustrating the semiconductor chip 22 of the tenth embodiment.

In the semiconductor device 100h according to the tenth embodiment as shown in FIGS. 22A and 22B and FIG. 23, portions 81, 82, and 83 are provided as one body in the semiconductor chip 22. The portion 81 and the portion 82 correspond to the region 30 of the first embodiment (referring to FIG. 2A).

The portion 81 is disposed in a region directly above the interconnect member 61 electrically connecting the semiconductor chip 21 to the base 1. The interconnect member 61 is, for example, a wire formed in a loop. The portion 82 is disposed in a region including a region directly above a center C of the semiconductor chip 21. For example, in the case where the configuration of the semiconductor chip 21 when viewed from the Z-axis direction is a rectangle, the center C of the semiconductor chip 21 is the intersection of the diagonal lines of the rectangle. The portion 83 corresponds to the portions 31 and 32 of the first embodiment (referring to FIG. 2A) and is disposed in part of a portion other than the region directly above the semiconductor chip 21. In the X-direction, the portion 83 is disposed at positions sandwiching the semiconductor chip 21. The portion 83 is bonded to the base 1 via a bonding portion 22A (referring to FIG. 2A).

The portions 81, 82, and 83 each extend in the Y-axis direction over the total length of the semiconductor chip 22. The portion 81 is provided at two locations; the portion 82 is provided at one location; the portion 83 is provided at two locations; and the portion 81 is positioned between the portion 82 and the portion 83. In other words, the portion 83, the portion 81, the portion 82, the portion 81, and the portion 83 are arranged in this order along the X-axis direction. The configuration of the portion 81 when viewed from above is two line configurations parallel to each other. In the Z-axis direction, the portion 82 is thicker than the portion 81; and the portion 83 is thicker than the portion 82. In the specification, the "thickness" refers to the length in the Z-axis direction. Because the upper surface of the semiconductor chip 22 is substantially flat, the different thicknesses of the portions 81, 82, and 83 cause the positions of the lower surfaces of the portions to be different.

In other words, the trench 180 that has the line configuration extending in the Y-axis direction is formed in the lower surface of the semiconductor chip 22; and the portion 82 is positioned at the bottom surface of the trench 180. A trench 183 that is deeper than the trench 180 is formed on the two sides of the trench 180; and the portion 81 is positioned at the bottom surface of the trench 183. The region where neither the trench 180 nor the trench 183 is formed corresponds to the portion 83.

The lower portion of a side surface 84 of the portion 83 facing the portion 82 is substantially parallel to the YZ plane. A curvature radius R of an upper end portion 84a of the side surface 84 is larger than a curvature radius R0 of a lower end portion 84b of the side surface 84. In other words, the upper end portion 84a is gradually rounded. In other words, the base of the portion 83 on the portion 81 side is gradually rounded.

An example of the dimensions of the portions is shown below.

The thickness of the entire semiconductor chip 22, i.e., the thickness of the portion 83, is, for example, 150 μm (micrometers). The thickness of the portion 81 is, for example, 30 μm. Therefore, the height of the space where the loop of the interconnect member 61 (the wire) is placed is 120 μm. The thickness of the portion 82 is, for example, 50 to 100 μm. Therefore, the height of the space where the semiconductor chip 21 is placed is 100 to 50 μm. The thickness of the semiconductor chip 21 is, for example, 30 μm. Therefore, the clearance between the semiconductor chip 21 and the portion 82 of the semiconductor chip 22 is 70 to 20 μm. It is favorable for the value of the ratio (hereinbelow, called the "R/D ratio") of the curvature radius R of the upper end portion 84a of the side surface 84 to a depth D to be 0.4 or more, and more favorable to be 0.8 or more, wherein D is the depth of the trench 183, i.e., the height of the side surface 84.

Otherwise, the configuration of the tenth embodiment is similar to that of the first embodiment. Namely, the semiconductor chip 22 is connected to the interconnect 11 of the base 1 by the wire used as the interconnect member 62. Also, on the semiconductor chip 22, the semiconductor chips 23 to 27 are stacked to be shifted slightly each chip; and the semiconductor chips 23 to 27 are connected to the interconnects 11 of the base 1 by the interconnect members 63 to 67. Also, the semiconductor chips 23 to 27 are not disposed in the region directly above the semiconductor chip 22 where the interconnect member 62 is connected to the pad electrode 22P. Also, for the semiconductor chips 23 to 27 as well, other semiconductor chips are not disposed in the regions directly above the pad electrodes 23P to 27P to which the interconnect members 63 to 67 are connected. Then, the semiconductor chips 21 to 27 are sealed by providing the insulative sealing member 8 on the base 1.

Effects of the tenth embodiment will now be described.

In the tenth embodiment, the portion 82 that is thicker than the portion 81 is provided in the semiconductor chip 22. Thereby, the strength of the central portion of the semiconductor chip 22 can be increased while ensuring the space for forming the loop of the wire in the portion 81; and the resistance to the mechanical stress applied from the outside can be increased.

For example, when picking up the semiconductor chips 22 from the dicing tape 171 after the process shown in FIG. 10H, the back surface of the dicing tape 171 is pushed upward by a push-up jig; and the semiconductor chip 22 is held from above by a collet. At this time, a large force is applied to the central portion of the semiconductor chip 22; therefore, there is a risk of damage if this portion is thin. However, in the semiconductor chip 22 of the tenth embodiment, the damage of the central portion can be suppressed because the portion 82 that is positioned at the central portion is thicker than the portion 81. The thickness at which the semiconductor chip 22 is not damaged is determined by various conditions and therefore cannot be determined unconditionally; but, for example, it is favorable for the thickness of the portion 82 to be 50 µm or more, and more favorable to be 100 µm or more.

By providing the portion 81 in the semiconductor chip 22, a relatively large gap can be formed between the base 1 and the portion 81 and between the semiconductor chip 21 and the portion 81. As a result, the insulative sealing member 8 is injected easily between the base 1 and the semiconductor chip 22 and between the semiconductor chip 21 and the semiconductor chip 22. If the portion 81 is not provided, there is a possibility that the insulative sealing member 8 may not be filled sufficiently; and an unfilled space may remain. As a result, the strength of the semiconductor device decreases. To avoid this decrease, it is necessary to increase pressure when injecting the insulative sealing member 8; but in such a case, there is a possibility of damage to the semiconductor chip, the wires, the bump bonding portions, etc. Also, it is necessary to use a special expensive resin material that has a low viscosity and can withstand the high pressure.

Conversely, according to the embodiment, the penetration of the resin material can be improved by providing the portion 81 in the semiconductor chip 22; the stress resistance at the central vicinity of the semiconductor chip 22 can be improved by providing the portion 82; and the stress can be dispersed by rounding the base of the portion 83. As a result, the filling of the resin material is easy; the productivity of the semiconductor device is increased; and the strength of the semiconductor device is increased.

Also, in the tenth embodiment, the curvature radius R of the upper end portion 84a of the side surface 84 is set to be larger than the curvature radius R0 of the lower end portion 84b of the side surface 84. The upper end portion 84a of the side surface 84 is a portion where the stress concentrates when mounting the semiconductor chip 22 to the base 1. Stress concentrates in the upper end portion 84a also due to vibrations accompanying the transport of the semiconductor chip 22. Therefore, by setting the curvature radius of this portion to be large, the concentration of the stress can be relaxed; and the damage of the semiconductor chip 22 can be suppressed.

Otherwise, the effects of the tenth embodiment are similar to those of the first embodiment.

Tenth Embodiment: First Modification

Figure 24A:
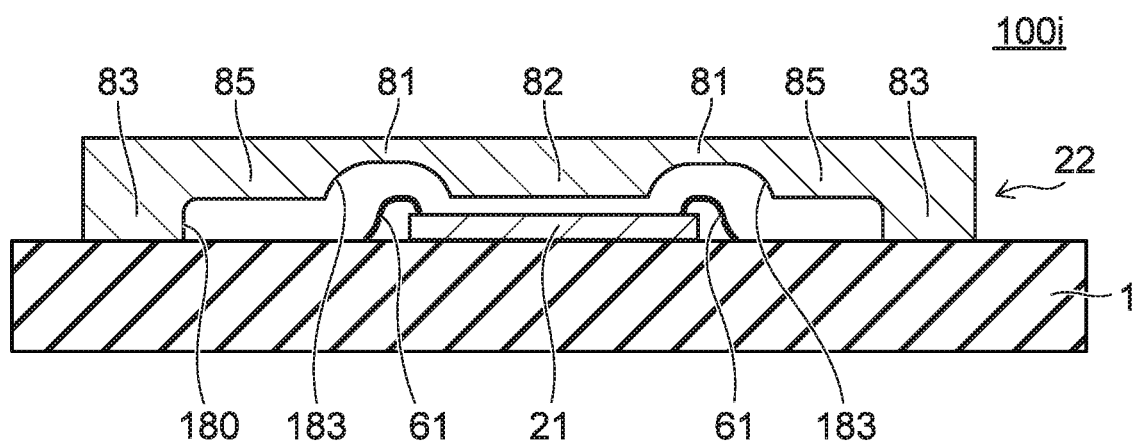
FIG. 24A is a schematic cross-sectional view illustrating a semiconductor device according to a first modification of the tenth embodiment.
Figure 24B:
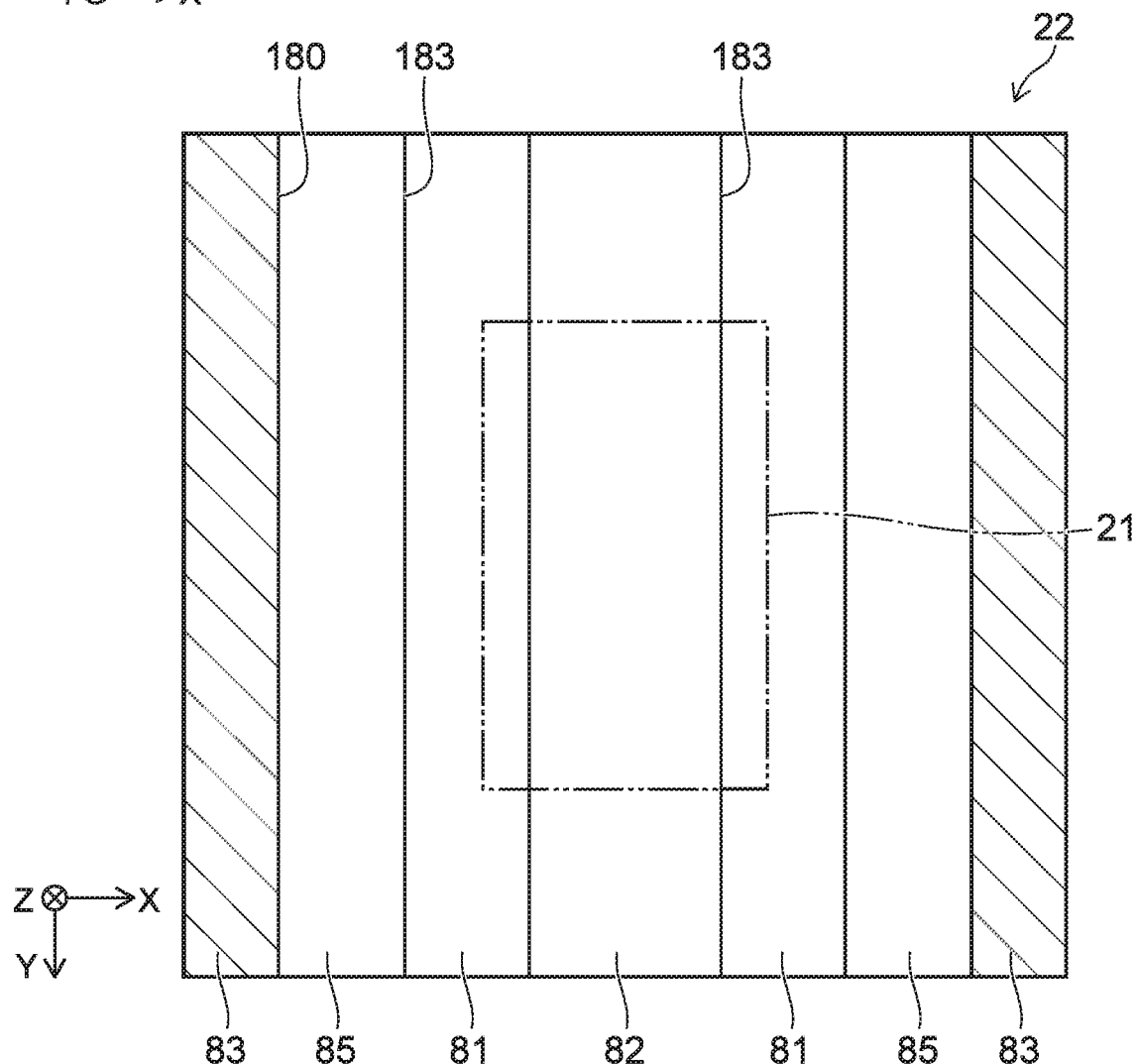
FIG. 24B is a schematic plan view illustrating the semiconductor chip of the first modification of the tenth embodiment.

FIG. 24A is a schematic cross-sectional view illustrating a semiconductor device according to a first modification of the tenth embodiment; and FIG. 24B is a schematic plan view illustrating the semiconductor chip 22 of the first modification of the tenth embodiment. Only the base 1, the semiconductor chip 21, the semiconductor chip 22, and the interconnect member 61 are shown in FIG. 24A.

In the semiconductor device 100i according to the first modification of the tenth embodiment as shown in FIGS. 24A and 24B, the trench 183 is formed in the interior of the trench 180. Therefore, the semiconductor chip 22 includes a portion 85 in addition to the portions 81, 82, and 83. The portion 85 is provided between the portion 81 and the portion 83 and extends in the Y-axis direction over the entire semiconductor chip 22. The thickness of the portion 85 is substantially equal to the thickness of the portion 82. In other words, the portion 85 is thicker than the portion 81 and thinner than the portion 83.

Otherwise, the configuration and the effects of the modification are similar to those of the tenth embodiment.

Eleventh Embodiment

Figure 25A:
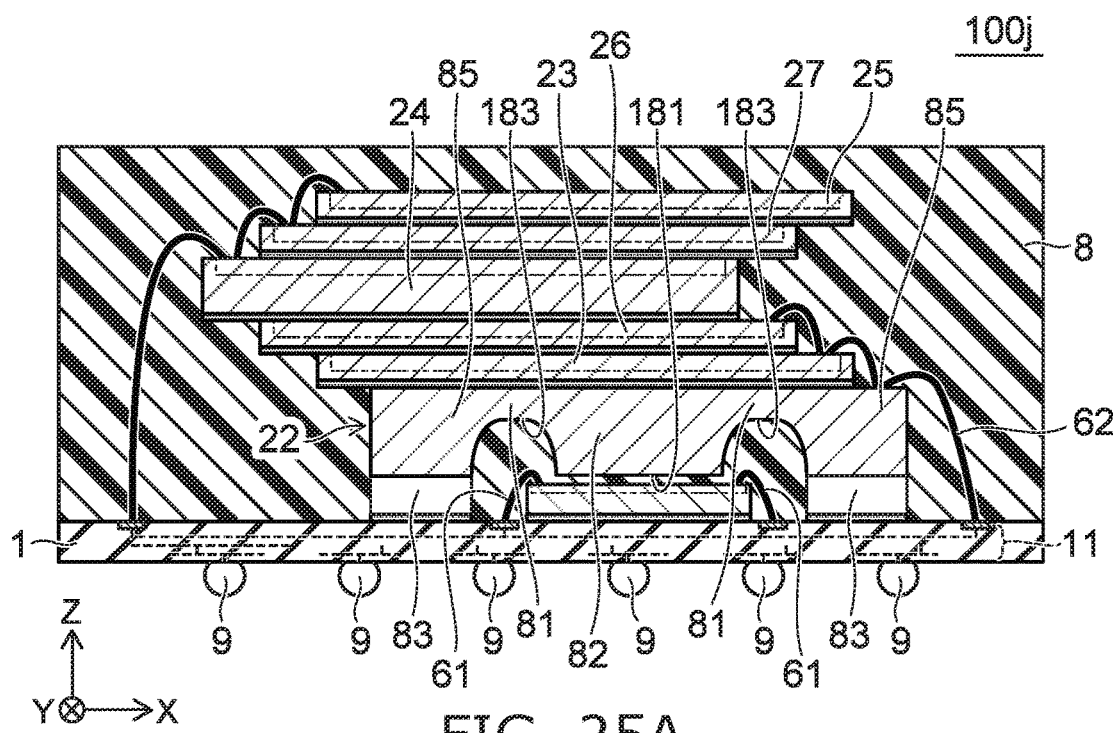
FIG. 25A is a schematic cross-sectional view illustrating a semiconductor package according to an eleventh embodiment.
Figure 25B:
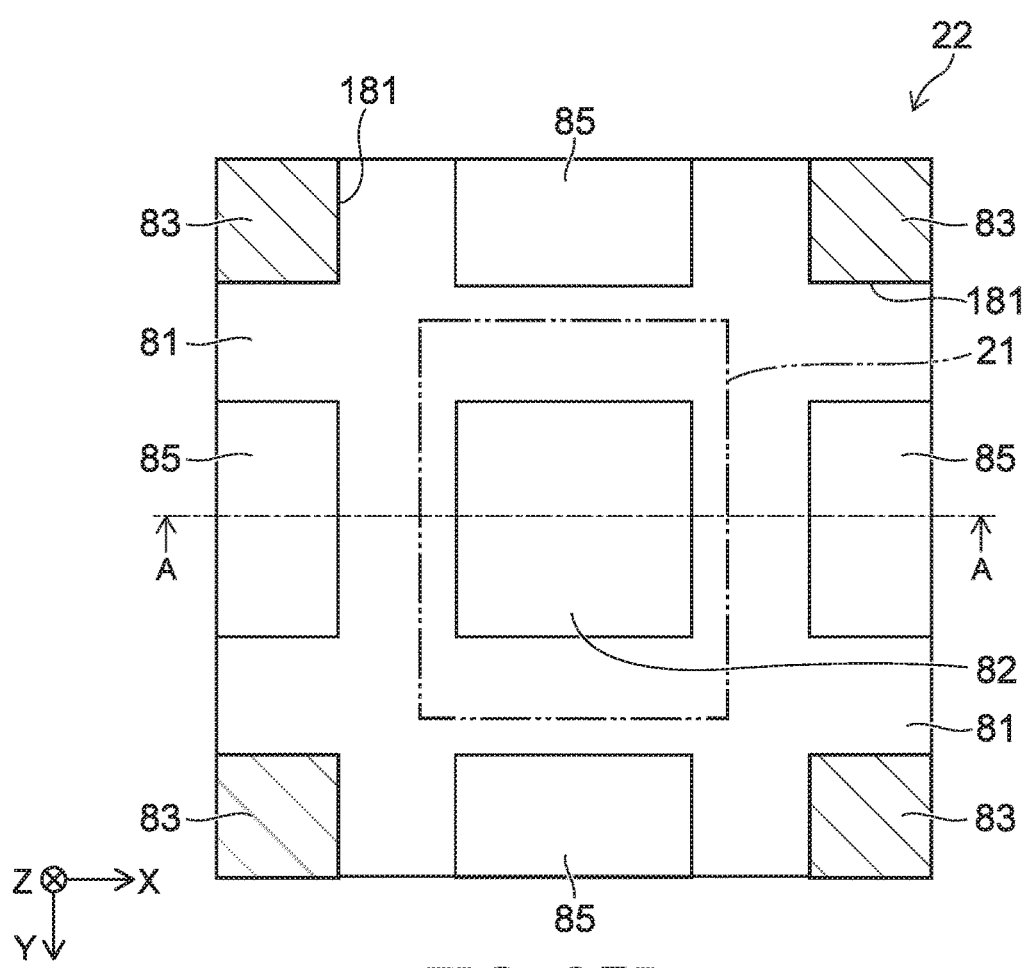
FIG. 25B is a schematic plan view illustrating the semiconductor chip 22 of the eleventh embodiment.

FIG. 25A is a schematic cross-sectional view illustrating a semiconductor package according to an eleventh embodiment; and FIG. 25B is a schematic plan view illustrating the semiconductor chip 22 of the eleventh embodiment. The cross section shown in FIG. 25A is along line A-A in FIG. 25B.

The eleventh embodiment is an example in which the second embodiment and the tenth embodiment are combined.

In the semiconductor device 100j according to the eleventh embodiment as shown in FIGS. 25A and 25B, the trench 181 that has a cross pattern configuration is formed in the lower surface of the semiconductor chip 22. Also, two trenches 183 that extend in the X-axis direction and two trenches 183 that extend in the Y-axis direction are formed along the outer edges of the trench 181. The portion 81 is provided at the bottom surfaces of the trenches 183.

Therefore, the configuration of the portion 81 when viewed from the Z-axis direction is a lattice configuration. Also, the portion 82 is disposed in one rectangular region surrounded with the portion 81 on four sides. The portion 85 is disposed in four rectangular regions surrounded with the portion 81 on three sides. The portion 83 is disposed in four rectangular regions surrounded with the portion 81 on two sides.

According to the embodiment, the filling of the insulative sealing member 8 is easy because two sides in the X-axis direction and two sides in the Y-axis direction are open when viewed from the semiconductor chip 21.

Otherwise, the configuration and the effects of the embodiment are similar to those of the tenth embodiment.

Eleventh Embodiment: First Modification

Figure 26A:
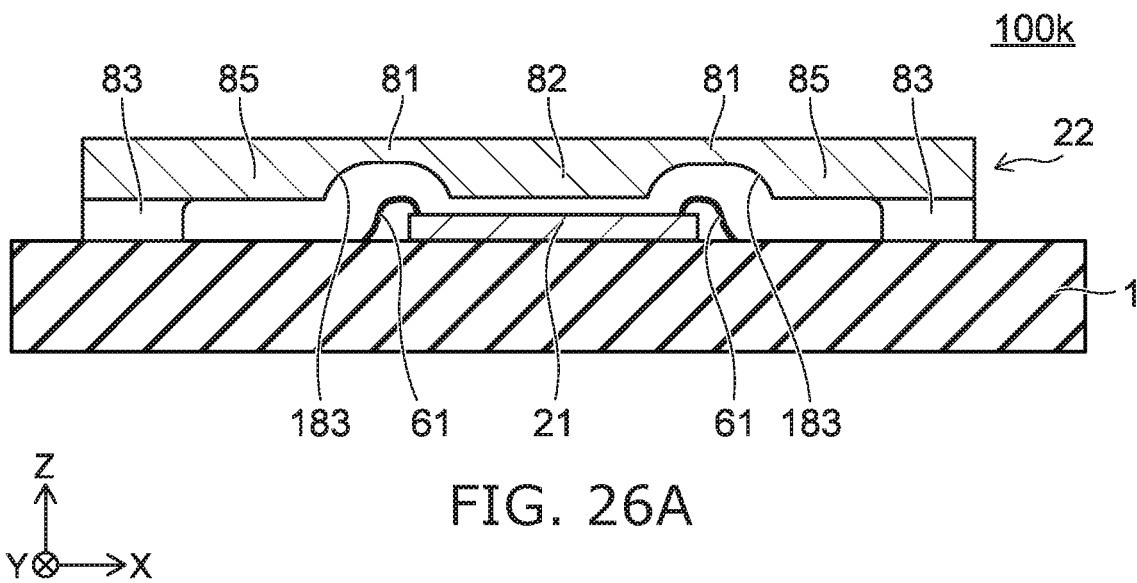
FIG. 26A is a schematic cross-sectional view illustrating a semiconductor device according to a first modification of the eleventh embodiment.
Figure 26B:
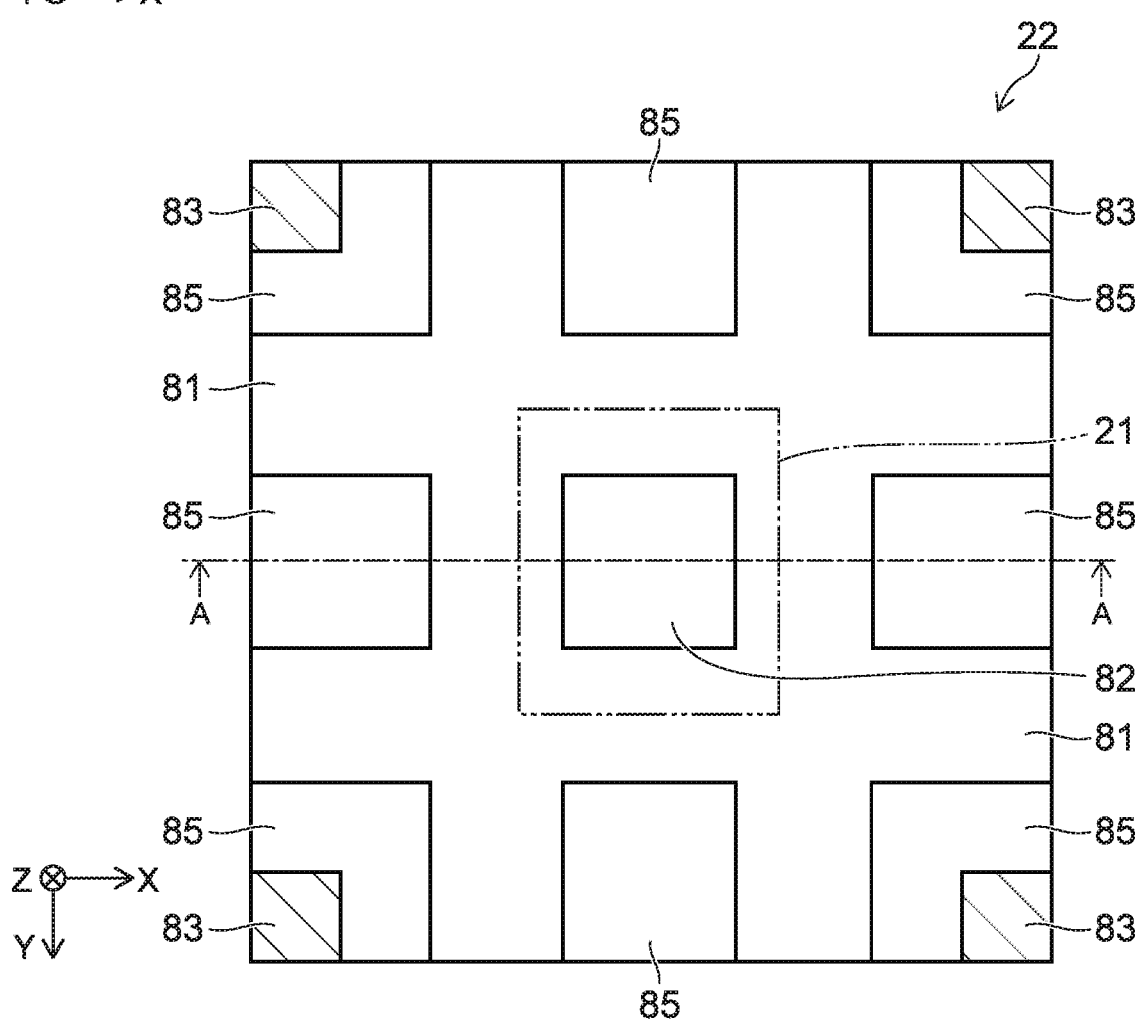
FIG. 26B is a schematic plan view illustrating the semiconductor chip of the first modification of the eleventh embodiment.

FIG. 26A is a schematic cross-sectional view illustrating a semiconductor device according to a first modification of the eleventh embodiment; and FIG. 26B is a schematic plan view illustrating the semiconductor chip 22 of the first modification of the eleventh embodiment. The cross section shown in FIG. 26A is along line A-A in FIG. 26B.

The modification is an example in which the eleventh embodiment and the first modification of the tenth embodiment are combined.

In the semiconductor device 100k according to the first modification of the eleventh embodiment as shown in FIGS. 26A and 26B, the portion 85 is provided also at the four corner portions of the semiconductor chip 22; and the portions 83 are provided at corner portions of these portions 85.

Otherwise, the configuration and the effects of the modification are similar to those of the eleventh embodiment.

The tenth embodiment, the eleventh embodiment, and the modifications of the tenth embodiment and the eleventh embodiment can be performed in combination with the embodiments described above and their modifications. For example, some of the terminal electrodes 71 may be disposed outside the region between the portions 83 (the portions 31 and 32) as in the first modification of the first embodiment (referring to FIG. 5A); a portion of the semiconductor chip 21 may be disposed outside the region between the portions 83 (the portions 31 and 32) as in the second modification of the first embodiment (referring to FIG. 5B); the portions 83 (the portions 31 and 32) may be provided along the major-axis direction of the semiconductor chip 22 as in the third modification of the first embodiment (referring to FIG. 6A); and the terminal electrodes 71 may not be disposed between the semiconductor chip 21 and the portions 83 (the portions 31 and 32) as in the fourth modification of the first embodiment (referring to FIG. 6B).

Also, the portions 83 (the portions 31, 32, 35, and 36) may be formed in a frame-like configuration as in the third embodiment (referring to FIGS. 8A and 8B); the thicknesses of the semiconductor chips 23 to 27 may be substantially equal to each other as in the seventh embodiment (referring to FIG. 16); and notches may be formed in the lower surface of the portion of the semiconductor chip 22 other than the portions 83 (the portions 31 and 32) as in the eighth embodiment (referring to FIGS. 17A and 17B).

Twelfth Embodiment

FIGS. 27A to 27D are schematic cross-sectional views in order of the processes, illustrating a method for manufacturing a semiconductor device according to a twelfth embodiment. The method for manufacturing the semiconductor device 100h according to the tenth embodiment (referring to FIG. 22A) is described in the twelfth embodiment.

As shown in FIG. 22A, the semiconductor chip 21 is mounted on the base 1. Then, the semiconductor chip 21 is electrically connected to the base 1 by wires which are the interconnect members 61.

Figure 27A:
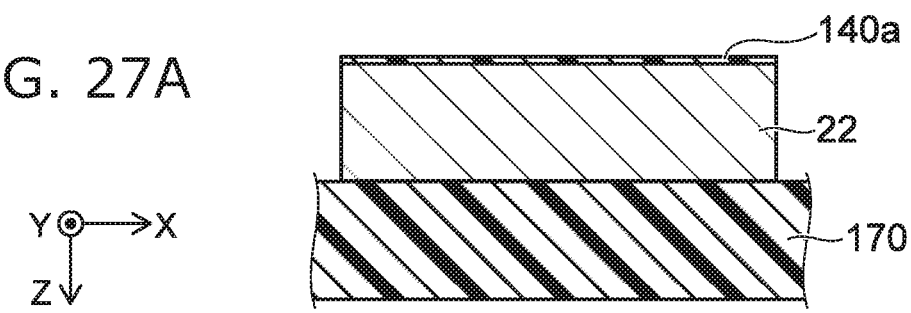
FIGS. 27A to 27D are schematic cross-sectional views in order of the processes, illustrating a method for manufacturing a semiconductor device according to a twelfth embodiment.

On the other hand, the processes shown in FIGS. 9A to 9F and FIGS. 10A to 10F are performed by the method described in the fourth embodiment. Thereby, as shown in FIG. 27A, an intermediate structure body is made in which the multiple semiconductor chips 22 are singulated on the dicing tape 170 and arranged in a matrix configuration. The DAF 140a is bonded to the upper surfaces of the semiconductor chips 22.

Figure 27B:
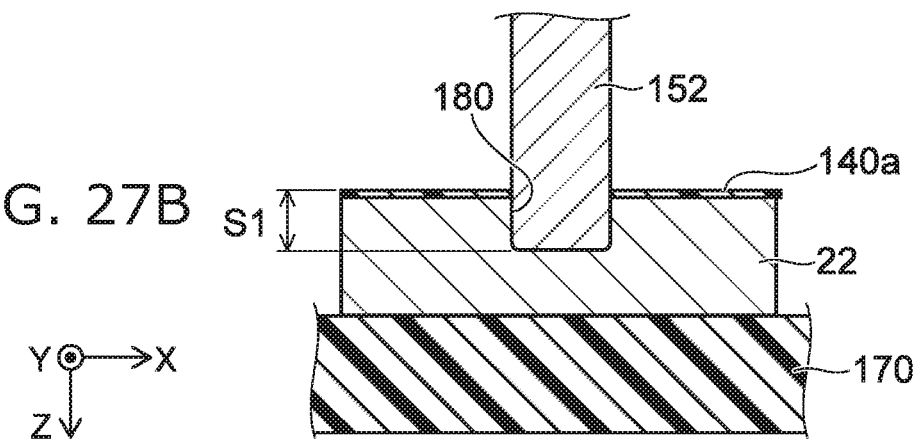

Then, as shown in FIG. 27B, the upper surfaces of the multiple semiconductor chips 22 that are arranged in the matrix configuration are ground to a depth S1 using a blade 152. A wide flat blade that has a relatively wide width and a flat grinding surface having corner portions with small curvature radii is used as the blade 152. Thereby, the trench 180 that has a line configuration is formed in the lower surface of the semiconductor chip 22. A trench 180 that is wider than the width of the blade 152 may be formed by performing the grinding by the blade 152 multiple times while shifting the position.

Figure 27C:
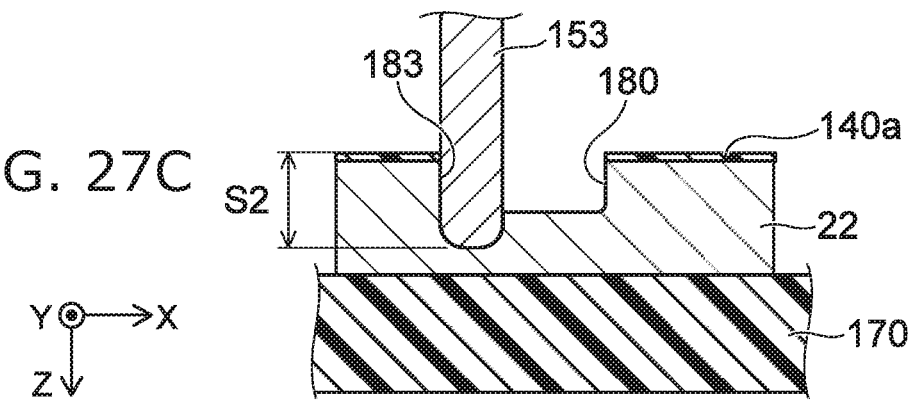

Continuing as shown in FIG. 27C, one end portion of the trench 180 at the upper surface of the semiconductor chip 22 is ground to a depth S2 using a blade 153. The depth S2 is set to be deeper than the depth S1. A fine elliptic blade that has a finer width than the blade 152 and has a grinding surface protruding in an elliptical configuration with corner portions having large curvature radii is used as the blade 153. R is the curvature radius of the corner portion of the blade 153. Thereby, the trench 183 that has a line configuration deeper than the trench 180 is formed in one end portion of the trench 180. At this time, the corner portions of the trench 183 are rounded to reflect the rounded corner portions of the blade 153.

Figure 27D:
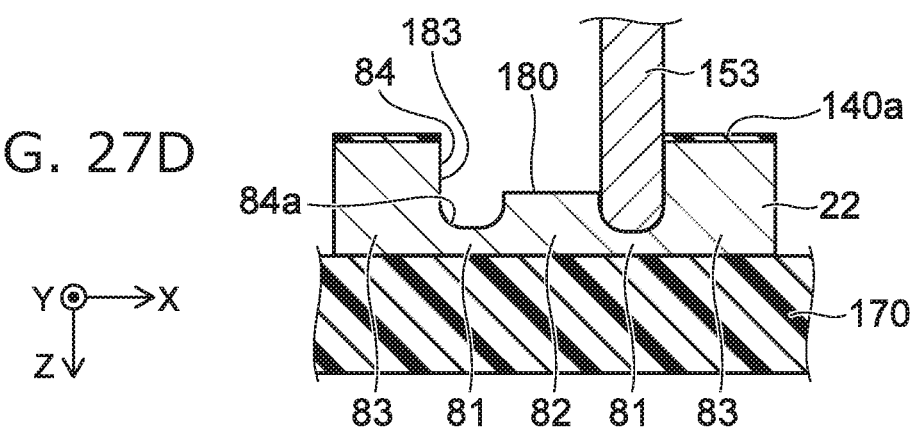

Then, as shown in FIG. 27D, the other end portion of the trench 180 at the upper surface of the semiconductor chip 22 is ground to the depth S2 using the blade 153. Thereby, the trench 183 is formed at the two end portions of the trench 180. The bottom portion of the trench 183 of the semiconductor chip 22 is the portion 81. The portion of the bottom portion of the trench 180 where the trench 183 is not formed is the portion 82. The portion of the semiconductor chip 22 where neither the trench 180 nor the trench 183 is formed is the portion 83. The base portion of the portion 83, i.e., the upper end portion 84a of the side surface 84, corresponds to the corner portion of the trench 183 and therefore is rounded.

Continuing as shown in FIG. 10H, the semiconductor chips 22 are inverted; and the DAF 140a is bonded to the dicing tape 171. Then, the adhesive force is reduced by irradiating ultraviolet on the dicing tape 171, etc. Then, the semiconductor chips 22 are picked up from the dicing tape 171. At this time, the damage of the semiconductor chip 22 can be suppressed because the portion 82 that is positioned at the central portion of the semiconductor chip 22 is thicker than the portion 81.

Then, positional alignment is performed so that the portion 81 of the semiconductor chip 22 opposes the interconnect member 61 (the wire) and the portion 82 opposes the center C of the semiconductor chip 21 (referring to FIG. 23); and the semiconductor chip 22 is mounted on the base 1 by bonding the portion 83 to the base 1. At this time, the portion 81 is thin and therefore does not interfere with the loop of the wire which is the interconnect member 61. Also, the base portion of the portion 83 is rounded; therefore, the concentration of stress in the base of the portion 83 and the damage of this portion can be suppressed.

Continuing as shown in FIG. 22A, the semiconductor chips 23, 26, and 24 are stacked on the semiconductor chip 22 to be slightly shifted each chip toward one side in the X-axis direction. Then, the semiconductor chip 22 is wire-bonded to the base 1 using the interconnect member 62; the semiconductor chip 23 is wire-bonded to the base 1 using the interconnect member 63; and the semiconductor chip 26 is wire-bonded to the base 1 using the interconnect member 65. Then, the semiconductor chips 27 and 25 are stacked on the semiconductor chip 24 to be slightly shifted each chip toward the other side in the X-axis direction. Then, the semiconductor chip 24 is wire-bonded to the base 1 using the interconnect member 64; the semiconductor chip 27 is wire-bonded to the base 1 using the interconnect member 66; and the semiconductor chip 25 is wire-bonded to the base 1 using the interconnect member 67. Then, the semiconductor chips 21 to 27 are sealed with the insulative sealing member 8 on the base 1. Thus, the semiconductor device 100h is manufactured.

Effects of the twelfth embodiment will now be described.

In the twelfth embodiment, the portions 81 to 83 can be made individually by forming the trench 180 and the trench 183 having different depths. Also, the base of the portion 83 can be rounded by using the fine elliptic blade having the corner portions having large curvature radii when forming the trench 183. By setting the portion 81 to be sufficiently thin, space can be ensured for the looping of the interconnect member 61; and by setting the portion 82 to be thicker than the portion 81 and by rounding the base of the portion 83, the strength of the semiconductor chip 22 can be ensured; and the damage of the semiconductor chip 22 in the manufacturing processes of the semiconductor device can be suppressed.

Otherwise, the manufacturing method and the effects of the embodiment are similar to those of the fourth embodiment.

The order may be interchanged for the process of forming the trench 180 shown in FIG. 27B and the process of forming the trench 183 shown in FIGS. 27C and 27D.

The twelfth embodiment can be implemented in combination with the embodiments described above and their modifications. For example, the wafer may be cut into the multiple semiconductor chips 22 by forming the trenches 180 and 183 in the wafer and subsequently dicing from the opposite side of the trench 180, etc., as in the fifth embodiment (referring to FIGS. 11A to 11G and FIGS. 12A to 12H); the wafer may be cut into the multiple semiconductor chips 22 by forming the trenches 180 and 183 in the wafer and subsequently dicing from the same side as the trench 180, etc., as in the first modification of the fifth embodiment (referring to FIGS. 13A to 13C); and DBG in which the dicing process is performed before the BSG process is applicable as in the sixth embodiment (referring to FIGS. 14A to 14G and FIGS. 15A to 15H).

Test Example

A test example showing the effects of the tenth to twelfth embodiments will now be described.

Figure 28A:
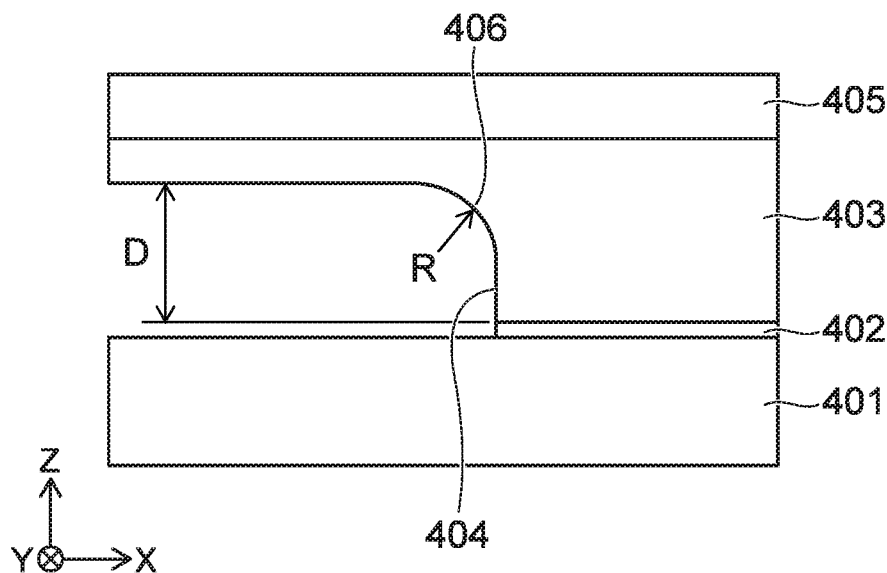
FIG. 28A is a drawing showing the structure assumed in the simulation.
Figure 28B:
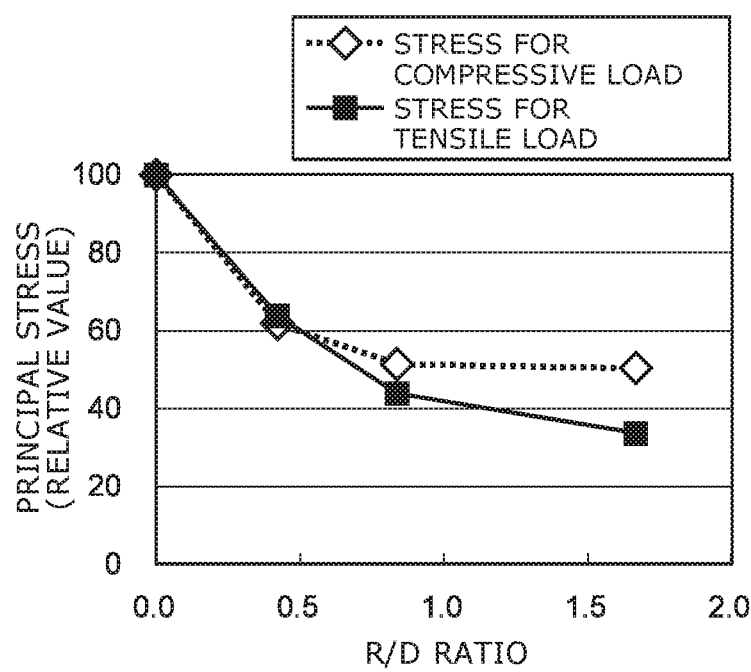
FIG. 28B is a graph showing the effects of the rounding of the corner portion on the stress concentration, in which the horizontal axis is the R/D ratio, and the vertical axis is the principal stress applied to the corner portion.

FIG. 28A is a drawing showing the structure assumed in the simulation; and FIG. 28B is a graph showing the effects of the rounding of the corner portion on the stress concentration, in which the horizontal axis is the R/D ratio, and the vertical axis is the principal stress applied to the corner portion.

In the test example, a simulation was performed; and the principal stress that is applied to the corner portion was determined. As shown in FIG. 28A, the structure of the simulation is a structure in which a DAF 402 is provided on a substrate 401 to model a multilayer interconnect substrate; and a chip 403 that is made of silicon is provided on the DAF 402. A trench 404 is formed in the lower surface of the chip 403. A collet 405 that is made of stainless steel is provided on the chip 403.

In the simulation modeling a compressive load due to the collet 405, the collet 405 is caused to press the chip 403 with a uniform force downward, that is, in the direction toward the substrate 401. On the other hand, in the simulation modeling the tensile load accompanying the vibrations when transferring, the collet 405 is caused to pull the chip 403 with a uniform force upward, that is, in the direction away from the substrate 401.

Then, the principal stress at a corner portion 406 was determined for different curvature radii R of the corner portion 406 of the trench 404. The depth of the trench 404 is D; and the ratio of the curvature radius R to the depth D is the R/D ratio. The physical property values of the component member are shown in Table 1. The R/D ratio and the principal stress applied to the corner portion 406 are shown in Table 2. FIG. 28B is a graph of the results shown in Table 2.

TABLE 1

| Component member | Young's modulus (GPa) | Poisson's ratio |
|---|---|---|
| Collet 405 | 210 | 0.33 |
| Chip 403 | 130 | 0.28 |
| DAF 402 | 5 | 0.28 |
| Substrate 401 | 24 | 0.28 |

TABLE 2

| | | Principal stress | |
|---|---|---|---|
| Example | R/D ratio | Compressive load | Tensile load |
| No. 1 | 0.00 | 100.0 | 100.0 |
| No. 2 | 0.42 | 61.7 | 63.8 |
| No. 3 | 0.83 | 51.2 | 43.9 |
| No. 4 | 1.67 | 50.5 | 33.2 |

As shown in Tables 2 and FIG. 28B, the principal stress that is applied to the corner portion 406 decreases as the R/D ratio increases. The reduction effect of the principal stress is pronounced when the R/D ratio is 0.4 or more, and more pronounced when the R/D ratio is 0.8 or more.

Thus, according to the embodiments, a semiconductor device and a method for manufacturing the semiconductor device can be provided in which a thickness reduction is possible.

Hereinabove, embodiments of the invention are described with reference to specific examples. However, the invention is not limited to these specific examples. For example, one skilled in the art may similarly practice the invention by appropriately selecting specific configurations of components included in the semiconductor devices of the embodiments such as the base 1, the semiconductor chip 21, the semiconductor chip 22, etc., from known art; and such practice is within the scope of the invention to the extent that similar effects can be obtained. For example, in the embodiments, the semiconductor chip 22 is a semiconductor memory chip, and the semiconductor chip 21 is a controller chip; but this is not limited thereto.

Any two or more components of the specific examples may be combined within the extent of technical feasibility and are within the scope of the invention to the extent that the spirit of the invention is included.

Also, all semiconductor devices practicable by an appropriate design modification by one skilled in the art based on the semiconductor devices described above as the embodiments of the invention also are within the scope of the invention to the extent that the spirit of the invention is included.

Various modifications and alterations within the spirit of the invention will be readily apparent to those skilled in the art; and all such modifications and alterations should be seen as being within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a base;
a first semiconductor chip mounted on the base; and
a second semiconductor chip provided above the first semiconductor chip,
the second semiconductor chip including
a first portion,
a second portion including a region directly above a center of the first semiconductor chip, the second portion being thicker than the first portion, notches being provided on a bottom surface of the second portion, and
a third portion including part of a portion of the second semiconductor chip other than a region directly above the first semiconductor chip, the third portion being thicker than the second portion and being disposed at a position sandwiching the first semiconductor chip.

2. The device according to claim 1, wherein a curvature radius of an upper end portion of a side surface of the third portion facing the second portion is larger than a curvature radius of a lower end portion of the side surface.

3. The device according to claim 1, further comprising:
a first wire connecting the first semiconductor chip to the base;
a second wire electrically connecting the second semiconductor chip to the base;
a plurality of third semiconductor chips provided on the second semiconductor chip; and
a plurality of third wires electrically connecting the third semiconductor chip to the base,
the first portion being disposed in a region directly above the first wire,
the third semiconductor chips not being disposed in a region directly above a portion of the second semiconductor chip where the second wire is connected,
for one of the third semiconductor chips, other third semiconductor chips are not disposed in a region directly above a portion of the one of the third semiconductor chips where the third wire is connected.

4. The device according to claim 1, wherein a configuration of the first portion is two line configurations parallel to each other when viewed from above.

5. The device according to claim 1, wherein a configuration of the first portion is a lattice configuration when viewed from above.

6. A semiconductor device, comprising:
a base;
a first semiconductor chip mounted on the base; and
a second semiconductor chip provided above the first semiconductor chip,
the second semiconductor chip including
a first portion,
a second portion including a region directly above a center of the first semiconductor chip, the second portion being thicker than the first portion, notches being provided on a bottom surface of the second portion, and
a third portion including part of a portion of the second semiconductor chip other than a region directly above the first semiconductor chip, the third portion being thicker than the second portion and being disposed at a position sandwiching the first semiconductor chip,
wherein a curvature radius of an upper end portion of a side surface of the third portion facing the second portion is larger than a curvature radius of a lower end portion of the side surface,
wherein an R/D ratio is 0.4 or more, D being a difference between a thickness of the third portion and a thickness of the first portion, R being the curvature radius of the upper end portion of the side surface.

7. The device according to claim 6, wherein the R/D ratio is 0.8 or more.

8. A semiconductor device, comprising:
a base;
a first semiconductor chip mounted on the base; and
a second semiconductor chip provided above the first semiconductor chip,
the second semiconductor chip including
a first portion,
a second portion including a region directly above a center of the first semiconductor chip, the second portion being thicker than the first portion, notches being provided on a bottom surface of the second portion, and
a third portion including part of a portion of the second semiconductor chip other than a region directly above the first semiconductor chip, the third portion being thicker than the second portion and being disposed at a position sandwiching the first semiconductor chip,
wherein the second semiconductor chip further includes a fourth portion positioned at an end portion of the second semiconductor chip, the fourth portion being thicker than the first portion and thinner than the third portion.

9. A method for manufacturing a semiconductor device, comprising:
mounting a first semiconductor chip on a base;
forming a plurality of first portions having line configurations by grinding a surface of a second semiconductor chip to a first depth;
forming a second portion having a line configuration by grinding the surface to a second depth shallower than the first depth, the forming the second portion including grinding the surface using a blade multiple times; and
mounting the second semiconductor chip at the base to cause the second portion to oppose a center of the first semiconductor chip.

* * * * *